(12) United States Patent
Kong et al.

(10) Patent No.: US 12,219,802 B2
(45) Date of Patent: Feb. 4, 2025

(54) DISPLAY DEVICE

(71) Applicant: Samsung Display Co., LTD., Yongin-si (KR)

(72) Inventors: Tae Jin Kong, Hwaseong-si (KR); Jin Yeong Kim, Icheon-si (KR); Jun Seok Min, Suwon-si (KR); Il You, Seongnam-si (KR); Hae Ju Yun, Hwaseong-si (KR); Seon Beom Ji, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 635 days.

(21) Appl. No.: 17/410,455

(22) Filed: Aug. 24, 2021

(65) Prior Publication Data

US 2022/0181587 A1 Jun. 9, 2022

(30) Foreign Application Priority Data

Dec. 7, 2020 (KR) .................. 10-2020-0169307

(51) Int. Cl.
*H10K 50/856* (2023.01)
*G09F 9/30* (2006.01)
*H10K 50/86* (2023.01)
*H10K 102/00* (2023.01)

(52) U.S. Cl.
CPC .......... *H10K 50/856* (2023.02); *G09F 9/301* (2013.01); *H10K 50/865* (2023.02); *H10K 2102/311* (2023.02)

(58) Field of Classification Search
CPC ............... H10K 50/856; H10K 50/865; H10K 2102/311; H10K 59/878; H10K 59/8792; G09F 9/301; G09F 9/33; H01L 27/156; H01L 25/0753; H01L 25/167; H01L 27/1214
See application file for complete search history.

(56) References Cited

U.S. PATENT DOCUMENTS

2011/0299002 A1* 12/2011 Won .................. G02F 1/133512
349/43
2022/0158049 A1* 5/2022 Itou ........................... G09F 9/33

FOREIGN PATENT DOCUMENTS

| KR | 10-2017-0026055 | 3/2017 |
|---|---|---|
| KR | 10-2018-0119197 | 11/2018 |
| KR | 10-1969065 | 8/2019 |
| KR | 10-2019-0110986 | 10/2019 |
| KR | 10-2019-0121894 | 10/2019 |
| KR | 10-2019-0124359 | 11/2019 |
| KR | 10-2020-0001648 | 1/2020 |
| KR | 10-2020-0001649 | 1/2020 |
| KR | 10-2020-0004936 | 1/2020 |
| KR | 10-2020-0014015 | 2/2020 |
| KR | 10-2020-0014112 | 2/2020 |
| KR | 10-2020-0034207 | 3/2020 |
| KR | 10-2020-0034277 | 3/2020 |
| KR | 10-2020-0036409 | 4/2020 |
| KR | 10-2020-0048729 | 5/2020 |

(Continued)

*Primary Examiner* — Thanh T Nguyen
(74) *Attorney, Agent, or Firm* — KILE PARK REED & HOUTTEMAN PLLC

(57) ABSTRACT

A display device comprises a display panel, a panel support member disposed on a surface of the display panel and including segments that are spaced apart from each other, and a reflective layer disposed between the segments.

13 Claims, 21 Drawing Sheets

(56) References Cited

FOREIGN PATENT DOCUMENTS

KR  10-2020-0073387  6/2020
KR  10-2020-0101037  8/2020

* cited by examiner

T1: ACT, G1, SE, DE

DISPLAY DEVICE

CROSS-REFERENCE TO RELATED APPLICATION(S)

This application claims priority to and benefits of Korean Patent Application No. 10-2020-0169307 under 35 U.S.C. 119, filed on Dec. 7, 2020 in the Korean Intellectual Property Office, the entire contents of which are incorporated herein by reference.

BACKGROUND

1. Technical Field

The disclosure relates to a display device.

2. Description of the Related Art

Display devices are becoming increasingly important with the development of multimedia. Accordingly, various types of display devices such as liquid crystal displays (LCDs) and organic light emitting displays (OLEDs) are being used. These display devices are being applied to an increasingly wide variety of devices, mainly to various mobile electronic devices, for example, portable electronic devices such as smartphones, smart watches, and tablet personal computers (PCs).

With the recent development of display device-related technologies, flexible display devices that can be bent like paper are being developed using a flexible material such as plastic instead of a conventional glass substrate that is not flexible. The flexible display devices may be divided into bendable display devices that can be bent without being broken and foldable display devices that can be folded. Recently, research has been conducted on a rollable display device that may be wound around and unwound from a roller as desired.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device capable of improving display quality by preventing a difference in contrast due to a difference in reflectivity.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an aspect of the disclosure, a display device may include a display panel, a panel support member disposed on a surface of the display panel and including segments that are spaced apart from each other, and a reflective layer disposed between the segments.

In an embodiment, the display device may further include non-overlap areas in which the segments and the display panel may not overlap, wherein the reflective layer may be disposed in each of the non-overlap areas.

In an embodiment, the display device may further include overlap areas in which the segments and the display panel may overlap, wherein the reflective layer may be disposed in at least a portion of each of the overlap areas.

In an embodiment, a reflectivity of the reflective layer and a reflectivity of the segments may be equal.

In an embodiment, a reflectivity of the reflective layer may be in the range of about 90 to about 110% of a reflectivity of the segments.

In an embodiment, the segments may extend in a first direction and may be spaced apart from each other in a second direction.

In an embodiment, the reflective layer may extend in the first direction and may be spaced apart from another reflective layer in the second direction.

In an embodiment, the display device may further include a bonding member which may be disposed between the display panel and the segments.

In an embodiment, the reflective layer may be disposed on an upper surface of the bonding member and contact side surfaces of the segments.

In an embodiment, the display device may further include non-overlap areas in which the segments and the display panel do not overlap, wherein the reflective layer may be disposed between the display panel and the bonding member and may be disposed in each of the non-overlap areas.

In an embodiment, the reflective layer may be disposed on the upper surface of the bonding member and may not overlap the segments.

In an embodiment, the display device may further include non-overlap areas in which the segments and the display panel do not overlap, and overlap areas in which the segments and the display panel overlap, wherein the reflective layer and the bonding member may be disposed on a same layer, the reflective layer may be disposed in each of the non-overlap areas, and the bonding member may be disposed in each of the overlap areas.

In an embodiment, the reflective layer may be disposed between the bonding members and contact side surfaces of the bonding members.

According to an embodiment of the disclosure, a display device may include a display panel, a panel support member disposed on a surface of the display panel and including segments that are spaced apart from each other, and a light absorbing layer disposed between the display panel and the segments.

In an embodiment, the light absorbing layer may include a black matrix.

In an embodiment, the display device may further include a bonding member disposed between the display panel and the segments, wherein the light absorbing layer may be disposed between the display panel and the bonding member.

In an embodiment, the display device may further include non-overlap areas in which the segments and the display panel do not overlap, and overlap areas in which the segments and the display panel overlap, wherein the light absorbing layer may be disposed in the non-overlap areas and in the overlap areas.

In an embodiment, the display panel may include a first electrode and a second electrode which may be disposed on a substrate, a light emitting element disposed on the first electrode and the second electrode, and a first connection electrode connected to an end of the light emitting element, and a second connection electrode connected to another end of the light emitting element.

In an embodiment, the light emitting element may include a first semiconductor layer, a second semiconductor layer disposed on the first semiconductor layer, and a light emitting layer disposed between the first semiconductor layer and the second semiconductor layer.

In an embodiment, the display panel may be wound and unwound by the operation of the panel support member.

BRIEF DESCRIPTION OF THE DRAWINGS

These and/or other aspects will become apparent and more readily appreciated from the following description of embodiments, taken in conjunction with the accompanying drawings in which.

DETAILED DESCRIPTION OF THE EMBODIMENTS

Figure 1:
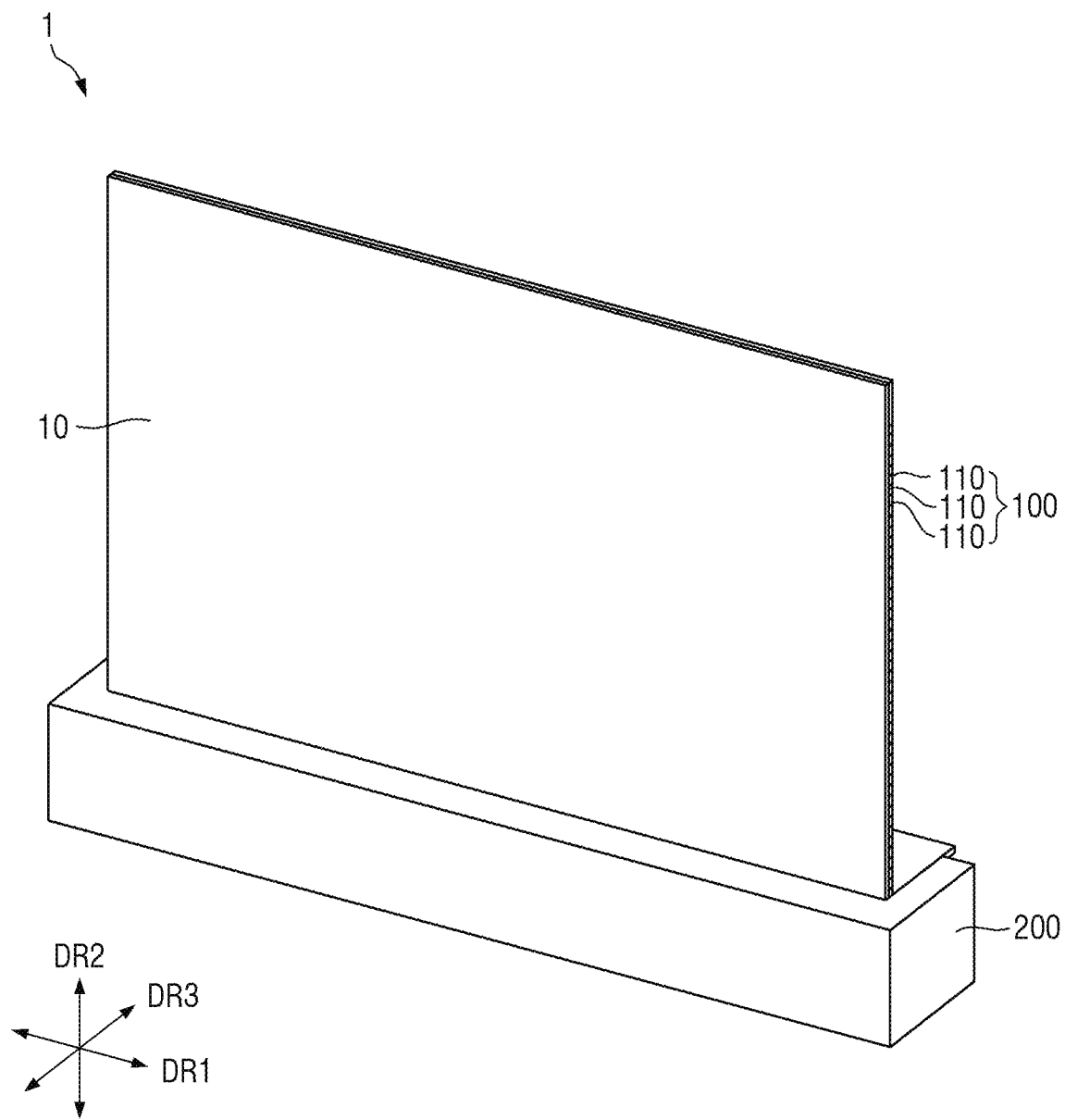
FIG. 1 is a schematic perspective view of a display device according to an embodiment.

The disclosure will now be described more fully hereinafter with reference to the accompanying drawings, in which embodiments are shown. This disclosure may, however, be embodied in different forms and should not be construed as limited to embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well (and vice versa), unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Each of the features of the various embodiments of the disclosure may be combined or combined with each other, in part or in whole, and technically various interlocking and driving may be possible. Each embodiment may be implemented independently of each other or may be implemented together in an association.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

When an element is described as "not overlapping" or "to not overlap" another element, this may include that the elements are spaced apart from each other, offset from each other, or set aside from each other or any other suitable term as would be appreciated and understood by those of ordinary skill in the art.

"About", "approximately", and "substantially", as used herein, are inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within 30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
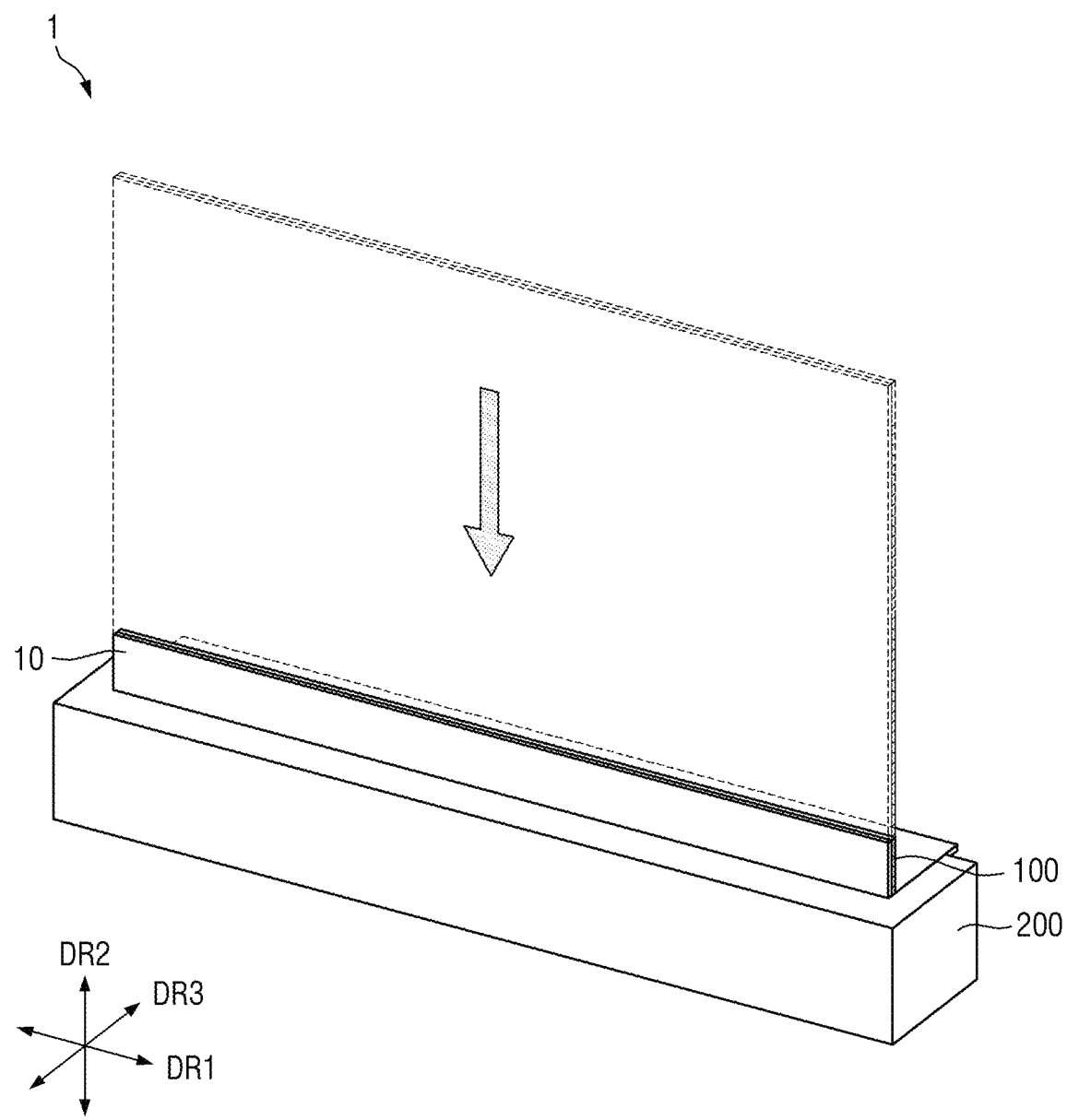
FIG. 2 is a schematic perspective view illustrating a display device according to an embodiment being inserted into a housing.
Figure 3:
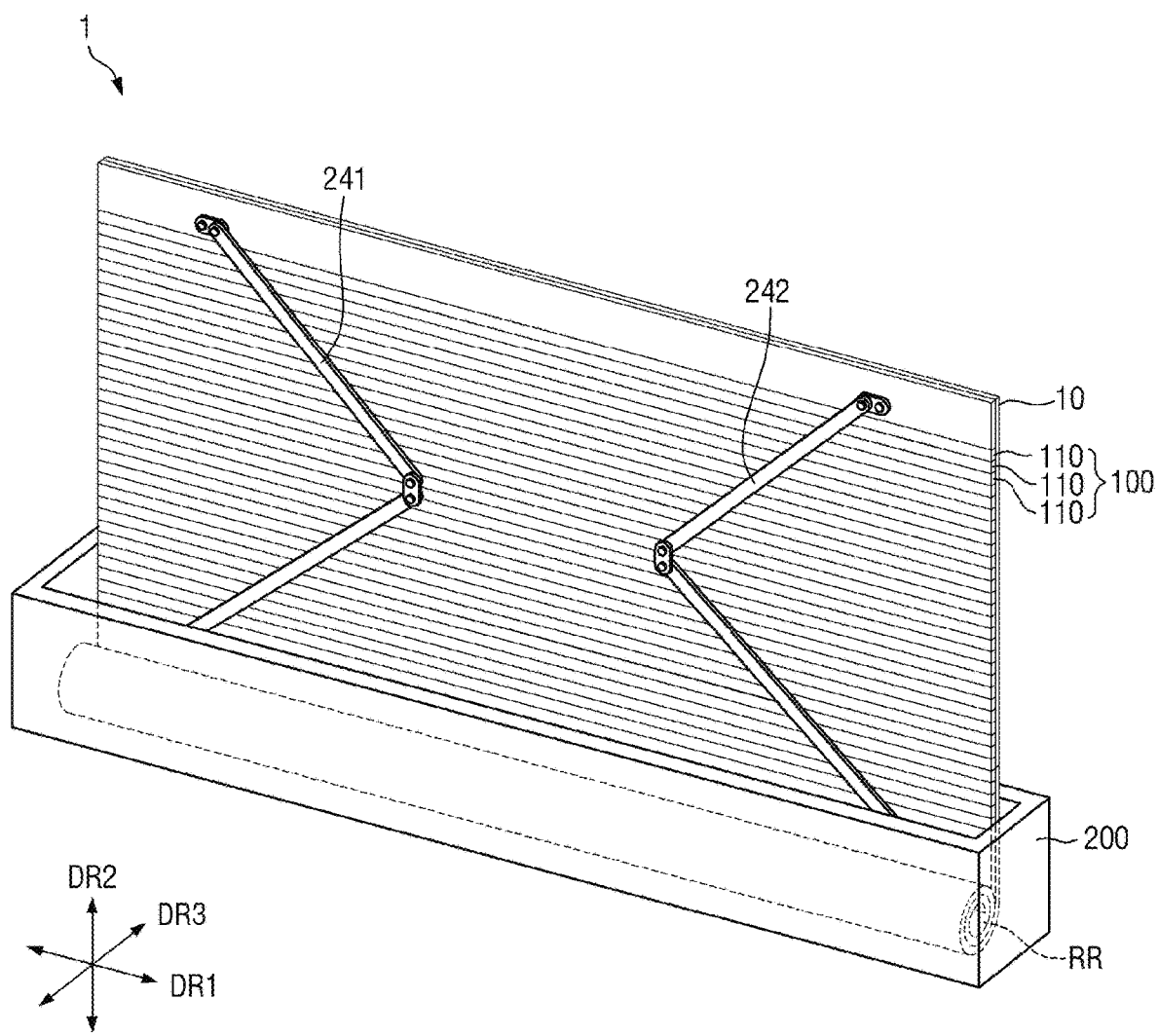
FIG. 3 is a schematic perspective view of a rear surface of a display device according to an embodiment.

FIG. 1 is a schematic perspective view of a display device 1 according to an embodiment. FIG. 2 is a schematic perspective view illustrating a display device 1 according to an embodiment being inserted into a housing 200. FIG. 3 is a schematic perspective view of a rear surface of a display device 1 according to an embodiment.

In the following description, a first direction DR1, a second direction DR2, and a third direction DR3 intersect in different directions. Based on a display panel 10, the first direction DR1 may be a horizontal direction, the second direction DR2 may be a vertical direction, and the third direction DR3 may be a thickness direction. The first direction DR1, the second direction DR2, and/or the third direction DR3 may include two or more directions. For example, the first direction DR1 may include a left direction toward a left side of the drawing and a right direction toward a right side of the drawing. However, the above directions may be illustrative and relative and are not limited to those mentioned above.

The display device 1 to be described below may be, but is not limited to, a rollable display device in which at least a portion of the flexible display panel 10 may be wound around and/or unwound from a roller RR.

Referring to FIGS. 1 through 3, the display device 1 may include the display panel 10, the roller RR, a panel support member 100, and the housing 200.

The display panel 10 may display a screen or an image. The display panel 10 may be a self-luminous display panel such as an organic light emitting display panel (OLED), an inorganic electroluminescent (EL) display panel, a quantum dot light emitting display panel (QED), a micro-light emitting diode (LED) display panel, a nano-LED display panel, a plasma display panel (PDP), a field emission display panel (FED) or a cathode ray tube (CRT) display panel or may be a light receiving display panel such as a liquid crystal display (LCD) panel or an electrophoretic display (EPD) panel.

The display panel 10 can be bent because it has flexibility. In some embodiments, at least a portion of the display panel 10 may be wound around the roller RR and mounted in the housing 200 but may also be wound around or unwound from the roller RR so that it can be inserted into or removed from the housing 200 through an opening at the top of the housing 200 as the display panel 10 ascends or descends.

The panel support member 100 may support the display panel 10. In an embodiment, the panel support member 100 may be, but is not limited to, a plate-shaped member which covers at least a portion of a surface of the display panel 10. The panel support member 100 may include multiple segments 110 rotatably connected to each other. Accordingly, the panel support member 100 may be attached to a surface of the display panel 10 and thus wound around and unwound from the roller RR together with the display panel 10. In some embodiments, the panel support member 100 may be a cover member, e.g., a bracket and/or a frame which may be coupled to an upper end of the display panel 10 to raise or lower the end of the display panel 10.

The roller RR may be configured as a cylindrical member and may wind and unwind the display panel 10 around and from itself as the display panel 10 ascends or descends.

The housing 200 may have, at its top, the opening through which the display panel 10 may be inserted and removed and provide an internal space for accommodating the display panel 10. In an embodiment, the housing 200 may be shaped like a rectangular parallelepiped having an opening formed in an upper surface thereof, but the disclosure is not limited thereto.

The display device 1 according to an embodiment may further include a first lifting member 241 and a second lifting member 242 which can raise or lower the display panel 10. The first lifting member 241 may be connected to an upper right corner of the display panel 10, and a length of the first lifting member 241 in the second direction DR2 may be varied to raise or lower a side of the display panel 10. The second lifting member 242 may be spaced apart from the first lifting member 241 and connected to an upper left corner of the display panel 10. A length of the second lifting member 242 in the second direction DR2 may be varied to raise or lower the other side of the display panel 10. Each of the first lifting member 241 and the second lifting member 242 may include lifting members which may be folded and unfolded to vary the length of the first or second lifting member 241 or 242 and at least one connection member which rotatably connects the lifting members.

The first lifting member 241 and the second lifting member 242 may raise and lower the display panel 10 through folding and unfolding operations. The display panel 10 may be unwound to be flat and removed from the housing 200 in case raised and may be wound and accommodated in the housing 200 in case lowered.

The display panel 10 of the display device 1 described above will now be described in detail with reference to other drawings.

Figure 4:
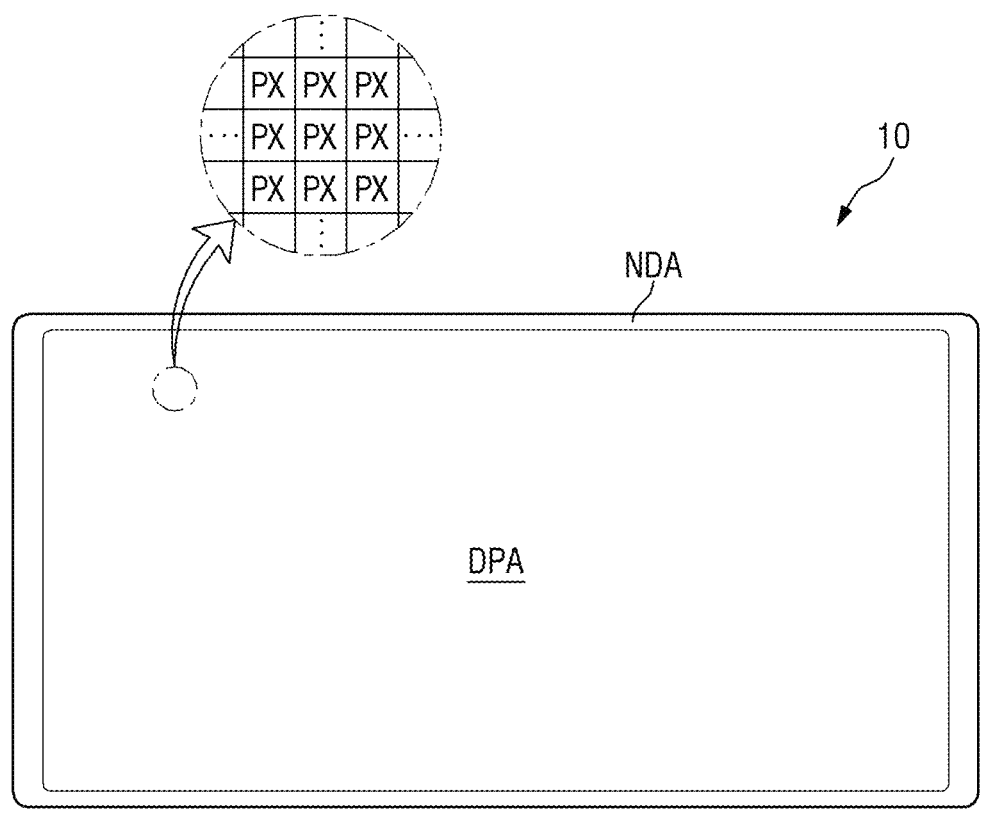
FIG. 4 is a schematic plan view of a display panel according to an embodiment.

FIG. 4 is a schematic plan view of a display panel 10 according to an embodiment.

Referring to FIG. 4, the display panel 10 may display moving images or still images. The display panel 10 may refer to any electronic device that provides a display screen. Examples of the display panel 10 may include televisions, notebook computers, monitors, billboards, Internet of things (IoT) objects, mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras and camcorders, all of which provide a display screen.

The shape of the display panel 10 can be variously modified. For example, the display panel 10 may have a rectangular shape including long sides that may be longer in the first direction DR1 than in the second direction DR2 in plan view. As another example, the display panel 10 may have a rectangular shape including long sides that may be longer in the second direction DR2 than in the first direction DR1 in plan view. However, the display panel 10 is not limited to the above shape and may also have other shapes such as a square, a quadrangle with rounded corners (vertices), other polygons, and a circle. The shape of a display area DPA of the display panel 10 may also be similar to the overall shape of the display panel 10. In FIG. 4, each of the display panel 10 and the display area DPA may be shaped like a rectangle that may be longer in the first direction DR1 than in the second direction DR2.

The display panel 10 may include the display area DPA and a non-display area NDA. The display area DPA may be an area where a screen can be displayed, and the non-display area NDA may be an area where no screen may be displayed. The display area DPA may also be referred to as an active area, and the non-display area NDA may also be referred to as an inactive area. The display area DPA may generally occupy the center of the display panel 10.

The display area DPA may include pixels PX. The pixels PX may be arranged in a matrix direction. Each of the pixels PX may be rectangular or square in plan view. However, the disclosure is not limited thereto, and each of the pixels PX may also have a rhombic planar shape having each side inclined with respect to a direction. The pixels PX may be alternately arranged in a stripe type or a pentile type. Each of the pixels PX may include one or more light emitting elements 30 which may emit light of a specific wavelength band to display a specific color.

The non-display area NDA may be disposed adjacent to (e.g., around) the display area DPA. The non-display area NDA may entirely or partially surround the display area DPA. The display area DPA may be rectangular, and the non-display area NDA may be disposed adjacent to four sides of the display area DPA. The non-display area NDA may form a bezel of the display panel 10. In each non-display area NDA, wirings or circuit drivers included in the display panel 10 may be disposed, and/or external devices may be mounted.

Figure 5:
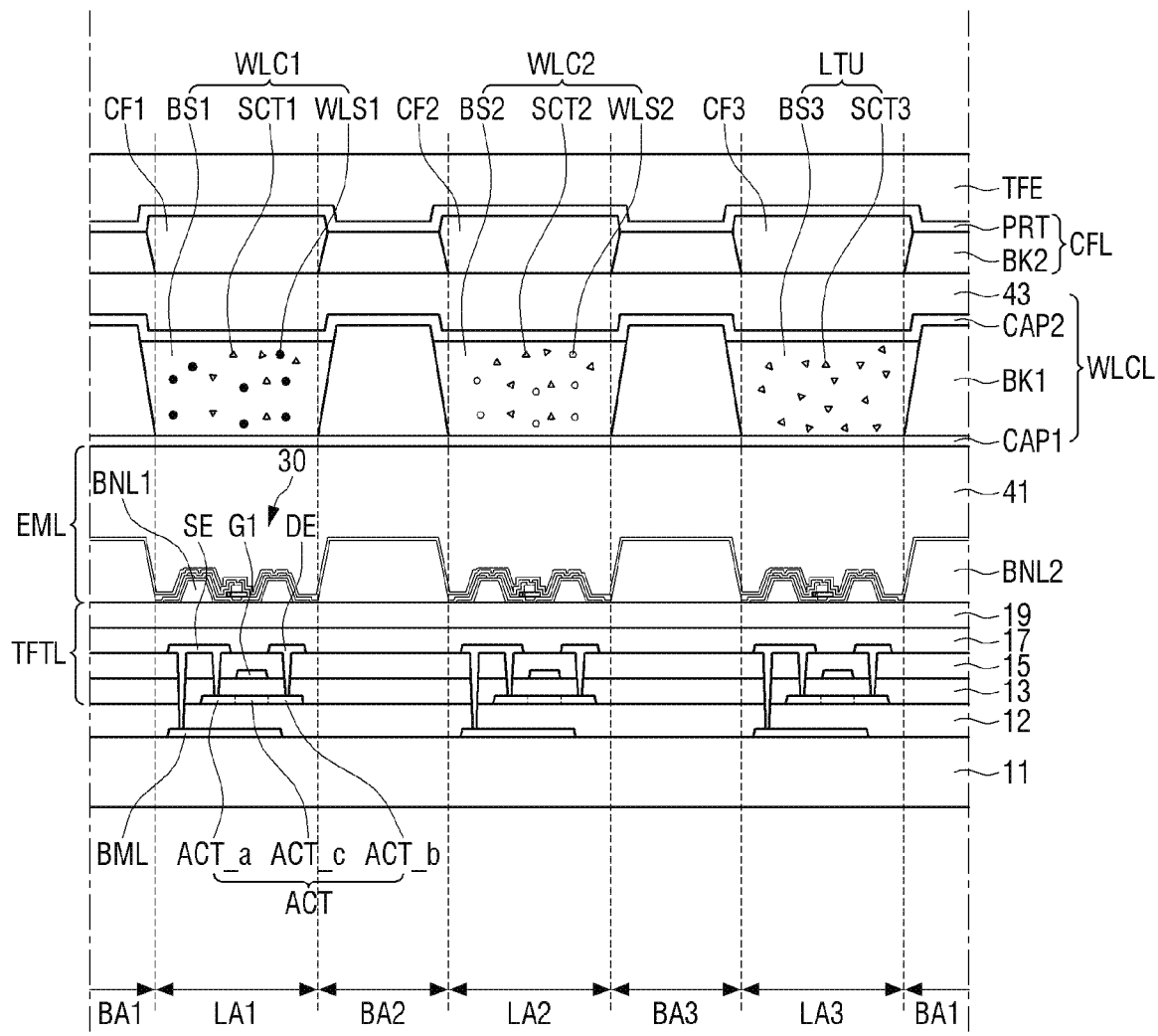
FIG. 5 is a schematic cross-sectional view of certain subpixels of a display panel according to an embodiment.
Figure 5:
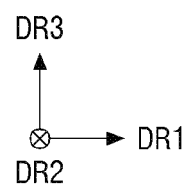

FIG. 5 is a schematic cross-sectional view of certain subpixels of a display panel 1 according to an embodiment.

Referring to FIG. 5, the display area DPA of the display panel 10 may include first through third light emitting areas LA1 through LA3. Each of the first through third light emitting areas LA1 through LA3 may be an area where light generated by a light emitting element 30 of the display panel 10 may be emitted to the outside of the display panel 10.

The display panel 10 may include a substrate 11, a buffer layer 12, a transistor layer TFTL, a light emitting element layer EML, a wavelength conversion layer WLCL, a color filter layer CFL, and an encapsulation layer TFE.

The substrate 11 may be a base substrate or a base member and may be made of an insulating material such as polymer resin. For example, the substrate 11 may be a flexible substrate that can be bent, folded, rolled, etc. The substrate 11 may include, but is not limited to, polyimide (PI).

The buffer layer 12 may be disposed on the substrate 11. The buffer layer 12 may be an inorganic layer that can prevent penetration of air or moisture. For example, the buffer layer 12 may include inorganic layers stacked alternately on each other.

The transistor layer TFTL may be disposed on the buffer layer 12. The transistor layer TFTL may include first transistors T1, a first gate insulating layer 13, a first interlayer insulating layer 15, a second interlayer insulating layer 17, and a first planarization layer 19.

The first transistors T1 may be disposed on the buffer layer 12 and may form respective pixel circuits of pixels. For example, the first transistors T1 may be driving transistors or switching transistors of the pixel circuits. Each of the first transistors T1 may include an active layer ACT, a gate electrode G1, a source electrode SE, and a drain electrode DE. The active layer ACT may include conducting regions ACT_a and ACT_b and a channel region ACT_c between them.

The light emitting element layer EML may be disposed on the transistor layer TFTL. The light emitting element layer EML may include first banks BNL1, light emitting elements 30, and a second bank BNL2. The light emitting elements 30 may be disposed between a first electrode and a second electrode and connected to each of a first connection electrode and a second connection electrode.

The transistor layer TFTL and the light emitting element layer EML will be described in detail later with reference to FIGS. 6 through 8.

A second planarization layer 41 may be disposed on the light emitting element layer EML to planarize the top of the light emitting element layer EML. The second planarization layer 41 may include an organic material. For example, the second planarization layer 41 may include at least one of acryl resin, epoxy resin, phenolic resin, polyamide resin, and polyimide resin.

The wavelength conversion layer WLCL may include a first capping layer CAP1, a first light blocking member BK1, a first wavelength conversion part WLC1, a second wavelength conversion part WLC2, a light transmission part LTU, a second capping layer CAP2, and a third planarization layer 43.

The first capping layer CAP1 may be disposed on the second planarization layer 41 of the light emitting element layer EML. The first capping layer CAP1 may seal lower surfaces of the first and second wavelength conversion parts WLC1 and WLC2 and the light transmission part LTU. The first capping layer CAP1 may include an inorganic material. For example, the first capping layer CAP1 may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

The first light blocking member BK1 may be disposed on the first capping layer CAP1 in first through third light blocking areas BA1 through BA3. The first light blocking member BK1 may overlap the second bank BNL2 in the thickness direction. The first light blocking member BK1 may block transmission of light. The first light blocking member BK1 may prevent color mixing by preventing intrusion of light between the first through third light emitting areas LA1 through LA3, thereby improving a color gamut. The first light blocking member BK1 may be disposed in a lattice shape surrounding the first through third light emitting areas LA1 through LA3 in plan view.

The first light blocking member BK1 may include an organic light blocking material and a liquid repellent component. Here, the liquid repellent component may be made of a fluorine-containing monomer or a fluorine-containing polymer, specifically, may include fluorine-containing aliphatic polycarbonate. For example, the first light blocking member BK1 may be made of a black organic material including a liquid repellent component. The first light blocking member BK1 may be formed by coating and exposing an organic light blocking material including a liquid repellent component.

The first light blocking member BK1 including a liquid repellent component may separate the first and second wavelength conversion parts WLC1 and WLC2 and the light transmission part LTU into corresponding light emitting areas LA1, LA2, LA3. For example, in case that the first and second wavelength conversion parts WLC1 and WLC2 and the light transmission part LTU are formed using an inkjet method, an ink composition may flow on an upper surface of the first light blocking member BK1. The first light blocking member BK1 including a liquid repellent component may guide the ink composition to flow into each light emitting area. Therefore, the first light blocking member BK1 can prevent mixing of ink compositions.

The first wavelength conversion part WLC1 may be disposed on the first capping layer CAP1 in the first light emitting area LA1. The first wavelength conversion part WLC1 may be surrounded by the first light blocking member BK1. The first wavelength conversion part WLC1 may include a first base resin BS1, first scatterers SCT1, and first wavelength shifters WLS1.

The first base resin BS1 may include a material having a relatively high light transmittance. The first base resin BS1 may be made of a transparent organic material. For example, the first base resin BS1 may include at least one of organic materials such as epoxy resin, acrylic resin, cardo resin, and imide resin.

The first scatterers SCT1 may have a refractive index different from that of the first base resin BS1 and may form an optical interface with the first base resin BS1. For example, the first scatterers SCT1 may include a light scattering material or light scattering particles that scatter at least a portion of transmitted light. For example, the first scatterers SCT1 may include metal oxide particles such as titanium oxide ($TiO_2$), zirconium oxide ($ZrO_2$), aluminum oxide ($Al_xO_y$), indium oxide ($In_2O_3$), zinc oxide (ZnO) or tin oxide ($SnO_2$) or may include organic particles such as acrylic resin or urethane resin, or a combination thereof. The first scatterers SCT1 may scatter incident light in random directions regardless of the incident direction of the incident light without substantially converting the peak wavelength of the incident light.

The first wavelength shifters WLS1 may convert or shift the peak wavelength of incident light into a first peak wavelength. For example, the first wavelength shifters WLS1 may convert blue light provided by the display panel 10 into red light having a single peak wavelength of about 610 to about 650 nm and emit the red light. The first wavelength shifters WLS1 may be quantum dots, quantum rods, or phosphors. The quantum dots may be particulate materials that emit light of a specific color in case that electrons transition from a conduction band to a valence band.

For example, the quantum dots may be semiconductor nanocrystalline materials. The quantum dots may have a specific band gap according to their composition and size. Thus, the quantum dots may absorb light and emit light having a unique wavelength. Examples of semiconductor nanocrystals of the quantum dots include group IV nanocrystals, group II-VI compound nanocrystals, group III-V compound nanocrystals, group IV-VI nanocrystals, and combinations of the same.

For example, the quantum dots may have a core-shell structure including a core containing the above-described nanocrystal and a shell surrounding the core. The shell of each quantum dot may serve as a protective layer for maintaining semiconductor characteristics by preventing chemical denaturation of the core and/or as a charging layer for giving electrophoretic characteristics to the quantum dot. The shell may be a single layer or a multilayer. An interface between the core and the shell may have a concentration gradient in which the concentration of an element present in the shell may be reduced toward the center. The shell of each quantum dot may be made of, for example, a metal or non-metal oxide, a semiconductor compound, or a combination of the same.

Light emitted from the first wavelength shifters WLS1 may have a full width of half maximum (FWHM) of an emission wavelength spectrum of about 45 nm or less, about 40 nm or less, or about 30 nm or less. Therefore, the color purity and color reproducibility of the display panel 10 can be further improved. The light emitted from the first wavelength shifters WLS1 may be radiated in various directions regardless of the incident direction of incident light. Therefore, the lateral visibility of red displayed in the first light emitting area LA1 can be improved.

A portion of blue light provided by the light emitting element layer EML may be transmitted through the first wavelength conversion part WLC1 without being converted into red light by the first wavelength shifters WLS1. Of the blue light provided by the light emitting element layer EML, light incident on a first color filter CF1 without being converted by the first wavelength conversion part WLC1 may be blocked by the first color filter CF1. Red light into which the blue light provided by the light emitting element layer EML has been converted by the first wavelength conversion part WLC1 may be emitted to the outside through the first color filter CF1. Therefore, the first light emitting area LA1 may emit red light.

The second wavelength conversion part WLC2 may be disposed on the first capping layer CAP1 in the second light emitting area LA2. The second wavelength conversion part WLC2 may be surrounded by the first light blocking member BK1. The second wavelength conversion part WLC2 may include a second base resin BS2, second scatterers SCT2, and second wavelength shifters WLS2.

The second base resin BS2 may include a material having a relatively high light transmittance. The second base resin BS2 may be made of a transparent organic material. For example, the second base resin BS2 may be made of the same material as the first base resin BS1 or may be made of any of the materials exemplified in the description of the first base resin BS1.

The second scatterers SCT2 may have a refractive index different from that of the second base resin BS2 and may form an optical interface with the second base resin BS2. For example, the second scatterers SCT2 may include a light scattering material or light scattering particles that scatter at least a portion of transmitted light. For example, the second scatterers SCT2 may be made of the same material as the first scatterers SCT1 or may be made of any of the materials exemplified in the description of the first scatterers SCT1. The second scatterers SCT2 may scatter incident light in random directions regardless of the incident direction of the incident light without substantially converting the peak wavelength of the incident light.

The second wavelength shifters WLS2 may convert or shift the peak wavelength of incident light into a second peak wavelength different from the first peak wavelength of the first wavelength shifters WLS1. For example, the second wavelength shifters WLS2 may convert blue light provided by the display panel 10 into green light having a single peak wavelength of about 510 to about 550 nm and emit the green light. The second wavelength shifters WLS2 may be quantum dots, quantum rods, or phosphors. The second wavelength shifters WLS2 may include a material having the same purpose as the materials exemplified in the description of the first wavelength shifters WLS1. The second wavelength shifters WLS2 may be made of quantum dots, quantum rods, or phosphors such that their wavelength conversion range may be different from the wavelength conversion range of the first wavelength shifters WLS1.

The light transmission part LTU may be disposed on the first capping layer CAP1 in the third light emitting area LA3. The light transmission part LTU may be surrounded by the first light blocking member BK1. The light transmission part LTU may transmit incident light while maintaining the peak wavelength of the incident light. The light transmission part LTU may include a third base resin BS3 and third scatterers SCT3.

The third base resin BS3 may include a material having a relatively high light transmittance. The third base resin BS3 may be made of a transparent organic material. For example, the third base resin BS3 may be made of the same material as the first or second base resin BS1 or BS2 or may be made of any of the materials exemplified in the description of the first or second base resin BS1 or BS2.

The third scatterers SCT3 may have a refractive index different from that of the third base resin BS3 and may form an optical interface with the third base resin BS3. For example, the third scatterers SCT3 may include a light scattering material or light scattering particles that scatter at least a portion of transmitted light. For example, the third scatterers SCT3 may be made of the same material as the first or second scatterers SCT1 or SCT2 or may be made of any of the materials exemplified in the description of the first or second scatterers SCT1 or SCT2. The third scatterers SCT3 may scatter incident light in random directions regardless of the incident direction of the incident light without substantially converting the peak wavelength of the incident light.

Since the wavelength conversion layer WLCL may be directly disposed on the second planarization layer 41 of the light emitting element layer EML, the display panel 10 may not require a separate substrate for the first and second wavelength conversion parts WLC1 and WLC2 and the light transmission part LTU. Therefore, the first and second wavelength conversion parts WLC1 and WLC2 and the light transmission part LTU can be easily aligned in the first through third light emitting areas LA1 through LA3, respectively, and the thickness of the display panel 10 can be relatively reduced.

The second capping layer CAP2 may cover the first and second wavelength conversion parts WLC1 and WLC2, the light transmission part LTU, and the first light blocking member BK1. For example, the second capping layer CAP2 may prevent damage to or contamination of the first and second wavelength conversion parts WLC1 and WLC2 and the light transmission part LTU by sealing the first and second wavelength conversion parts WLC1 and WLC2 and the light transmission part LTU. The second capping layer CAP2 may be made of the same material as the first capping layer CAP or may be made of any of the materials exemplified in the description of the first capping layer CAP1.

The third planarization layer 43 may be disposed on the second capping layer CAP2 to planarize the tops of the first and second wavelength conversion parts WLC1 and WLC2 and the light transmission part LTU. The third planarization layer 43 may include an organic material. For example, the third planarization layer 43 may include at least one of acryl resin, epoxy resin, phenolic resin, polyamide resin, and polyimide resin.

The color filter layer CFL may include a second light blocking member BK2, first through third color filters CF1 through CF3, and a protective layer PRT.

The second light blocking member BK2 may be disposed on the third planarization layer 43 of the wavelength conversion layer WLCL in the first through third light blocking areas BA1 through BA3. The second light blocking member BK2 may overlap the first light blocking member BK1 or the second bank BNL2 in the thickness direction. The second light blocking member BK2 may block transmission of light. The second light blocking member BK2 may prevent color mixing by preventing intrusion of light between the first through third light emitting areas LA1 through LA3, thereby improving the color gamut. The second light blocking member BK2 may be disposed in a lattice shape surrounding the first through third light emitting areas LA1 through LA3 in plan view.

The first color filter CF1 may be disposed on the third planarization layer 43 in the first light emitting area LA1. The first color filter CF1 may be surrounded by the second light blocking member BK2. The first color filter CF1 may overlap the first wavelength conversion part WLC1 in the thickness direction. The first color filter CF1 may selectively transmit light of the first color (e.g., red light) and block or absorb light of the second color (e.g., green light) and light of the third color (e.g., blue light). For example, the first color filter CF1 may be a red color filter and may include a red colorant. The red colorant may be made of red dye or red pigment.

The second color filter CF2 may be disposed on the third planarization layer 43 in the second light emitting area LA2. The second color filter CF2 may be surrounded by the second light blocking member BK2. The second color filter CF2 may overlap the second wavelength conversion part WLC2 in the thickness direction. The second color filter CF2 may selectively transmit light of the second color (e.g., green light) and block or absorb light of the first color (e.g., red light) and light of the third color (e.g., blue light). For example, the second color filter CF2 may be a green color filter and may include a green colorant. The green colorant may be made of green dye or green pigment.

The third color filter CF3 may be disposed on the third planarization layer 43 in the third light emitting area LA3. The third color filter CF3 may be surrounded by the second light blocking member BK2. The third color filter CF3 may overlap the light transmission part LTU in the thickness direction. The third color filter CF3 may selectively transmit light of the third color (e.g., blue light) and block or absorb light of the first color (e.g., red light) and light of the second color (e.g., green light). For example, the third color filter CF3 may be a blue color filter and may include a blue colorant. The blue colorant may be made of blue dye or blue pigment.

The first through third color filters CF1 through CF3 may absorb a portion of light coming from the outside of the display panel 10, thereby reducing reflected light due to the external light. Therefore, the first through third color filters CF1 through CF3 may prevent color distortion due to reflection of external light.

Since the first through third color filters CF1 through CF3 may be directly disposed on the third planarization layer 43 of the wavelength conversion layer WLCL, the display panel 10 may not require a separate substrate for the first through third color filters CF1 through CF3. Therefore, the thickness of the display panel 10 can be relatively reduced.

The protective layer PRT may cover the first through third color filters CF1 through CF3. The protective layer PRT may protect the first through third color filters CF1 through CF3.

The encapsulation layer TFE may be disposed on the protective layer PRT of the color filter layer CFL. The encapsulation layer TFE may cover upper and side surfaces of a display layer. For example, the encapsulation layer TFE may include at least one inorganic layer to prevent penetration of oxygen or moisture. The encapsulation layer TFE may include at least one organic layer to protect the display panel 10 from foreign substances such as dust.

The transistor layer TFTL and the light emitting element layer EML will now be described in detail through planar and cross-sectional structures of a pixel of a display device 1 according to an embodiment.

Figure 6:
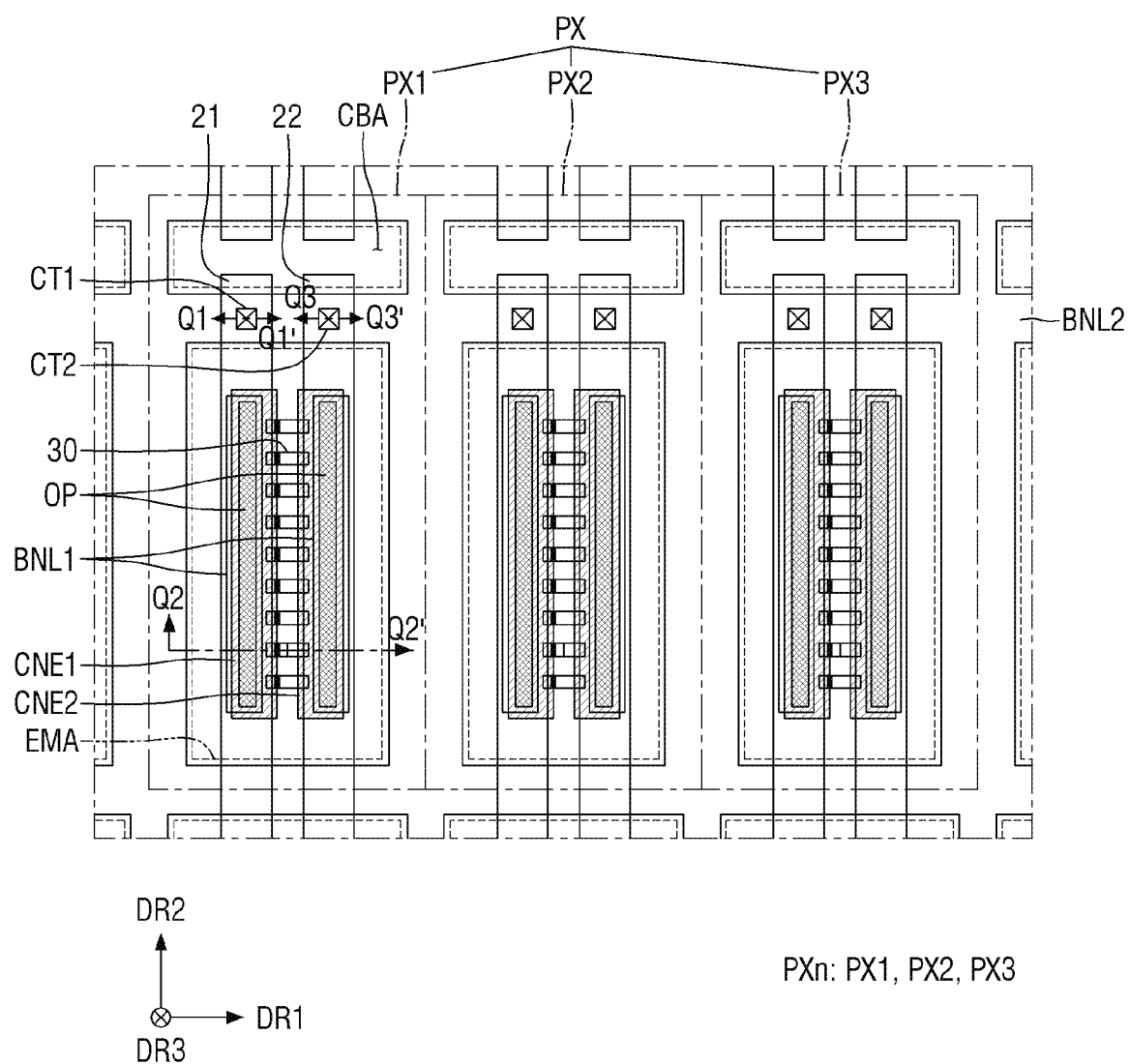
FIG. 6 is a schematic plan view of a pixel of a display device according to an embodiment.

FIG. 6 is a schematic plan view of a pixel PX of a display device 1 according to an embodiment.

Referring to FIG. 6, each of the pixels PX may include subpixels PXn (where n may be an integer of 1 to 3). For example, one pixel PX may include a first subpixel PX1, a second subpixel PX2 and a third subpixel PX3. The first subpixel PX1 may emit light of the first color, the second subpixel PX2 may emit light of the second color, and the third subpixel PX3 may emit light of the third color. For example, the first color may be blue, the second color may be green, and the third color may be red. However, the disclosure is not limited thereto, and the subpixels PXn may also emit light of the same color. Although one pixel PX includes three subpixels PXn in FIG. 6, the disclosure is not limited thereto, and the pixel PX may also include a larger number of subpixels PXn.

Each subpixel PXn of the display panel 10 may include an emission area EMA and a non-emission area (not illustrated). The emission area EMA may be an area in which light emitting elements 30 may be disposed to emit light of a specific wavelength band, and the non-emission area may be an area in which the light emitting elements 30 may not be disposed and from which no light may be output because light emitted from the light emitting elements 30 may not reach this area. The emission area may include an area in which the light emitting elements 30 may be disposed and an area which may be adjacent to the light emitting elements 30 and to which light emitted from the light emitting elements 30 may be output.

However, the disclosure is not limited thereto, and the emission area may also include an area from which light emitted from the light emitting elements 30 may be output after being reflected or refracted by other members. Light emitting elements 30 may be disposed in each subpixel PXn, and an area where the light emitting elements 30 may be disposed and an area adjacent to this area may form the emission area.

Each subpixel PXn may include a cut area CBA disposed in the non-emission area. The cut area CBA may be disposed on a side of the emission area EMA in the second direction DR2. The cut area CBA may be disposed between the emission areas EMA of subpixels PXn neighboring in the second direction DR2. Emission areas EMA and cut areas CBA may be arranged in the display area DPA of the display panel 10. For example, the emission areas EMA and the cut areas CBA may be repeatedly arranged in the first direction DR1 but alternately arranged in the second direction DR2. A gap between the cut areas CBA in the first direction DR1 may be smaller than a gap between the emission areas EMA in the first direction DR1. The second bank BNL2 may be disposed between the cut areas CBA and the emission areas EMA, and a gap between the cut areas CBA and the emission areas EMA may vary according to the width of the second bank BNL2. The cut area CBA may not emit light because the light emitting elements 30 may not be disposed in the cut area CBA, but portions of electrodes 21 and 22 disposed in each subpixel PXn may be disposed in the cut area CBA. The electrodes 21 and 22 disposed in each subpixel PXn may be separated in the cut area CBA.

Figure 7:
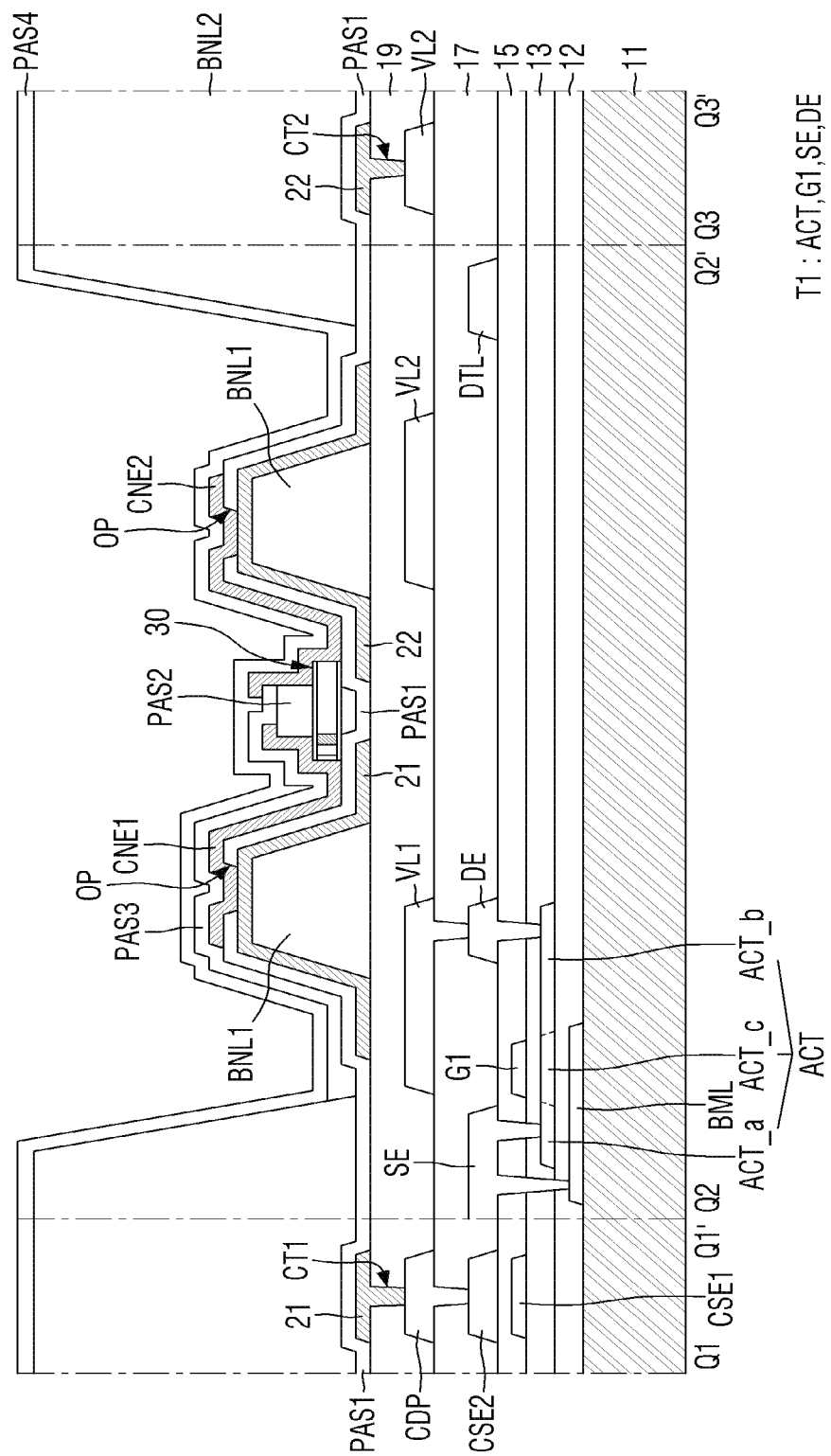
FIG. 7 is a schematic cross-sectional view taken along lines Q1-Q1', Q2-Q2' and Q3-Q3' of FIG. 6.

FIG. 7 is a schematic cross-sectional view taken along lines Q1-Q1', Q2-Q2' and Q3-Q3' of FIG. 6. FIG. 7 illustrates a cross section across both ends of a light emitting element 30 disposed in the first subpixel PX1 of FIG. 6.

Referring to FIG. 7 in conjunction with FIG. 6, the display panel 10 may include the substrate 11 and a semiconductor layer, conductive layers and insulating layers disposed on the substrate 11. The semiconductor layer, the conductive layers and the insulating layers may constitute a circuit layer and a light emitting element layer of the display panel 10.

A light blocking layer BML may be disposed on the substrate 11. The light blocking layer BML may be overlapped by the active layer ACT of a first transistor T1 of the display panel 10. The light blocking layer BML may include a light blocking material to prevent light from entering the active layer ACT of the first transistor T1. For example, the light blocking layer BML may be made of an opaque metal material that blocks transmission of light. However, the disclosure is not limited thereto. In some cases, the light blocking layer BML may be omitted.

The buffer layer 12 may be disposed on (e.g., entirely disposed) on the substrate 11 as well as the light blocking layer BML. The buffer layer 12 may be formed on the substrate 11 to protect the first transistors T1 of the pixels PX from moisture introduced through the substrate 11 which may be vulnerable to moisture penetration, and may perform a surface planarization function. The buffer layer 12 may be composed of inorganic layers stacked alternately on each other. For example, the buffer layer 12 may be a multilayer in which inorganic layers including at least one of silicon oxide ($SiO_x$), silicon nitride ($SiN_x$), and silicon oxynitride ($SiO_xN_y$) may be alternately stacked on each other.

The semiconductor layer may be disposed on the buffer layer 12. The semiconductor layer may include the active layer ACT of the first transistor T1. The active layer ACT may be overlapped (e.g., partially overlapped) by the gate electrode G1 of a first gate conductive layer which will be described later.

Although only the first transistor T1 among transistors included in the subpixels PXn of the display panel 10 is illustrated in the drawings, the disclosure is not limited thereto. The display panel 10 may also include more transistors. For example, the display panel 10 may include two or three transistors in each subpixel PXn by including one or more transistors in addition to the first transistor T1.

The semiconductor layer may include polycrystalline silicon, monocrystalline silicon, an oxide semiconductor, or the like, or a combination thereof. In case that the semiconductor layer includes an oxide semiconductor, each active layer ACT may include the conducting regions ACT_a and ACT_b and the channel region ACT_c disposed between them. The oxide semiconductor may be an oxide semiconductor containing indium (In). For example, the oxide semiconductor may be indium tin oxide (ITO), indium zinc oxide (IZO), indium gallium oxide (IGO), indium zinc tin oxide (IZTO), indium gallium tin oxide (IGTO), indium gallium zinc oxide (IGZO), indium gallium zinc tin oxide (IGZTO), or a combination thereof.

In an embodiment, the semiconductor layer may include polycrystalline silicon. The polycrystalline silicon may be formed by crystallizing amorphous silicon. Each of the conducting regions ACT_a and ACT_b of the active layer ACT may be a doping region doped with impurities.

The first gate insulating layer 13 may be disposed on the semiconductor layer and the buffer layer 12. The first gate insulating layer 13 may be disposed on the buffer layer 12 as well as the semiconductor layer. The first gate insulating layer 13 may function as a gate insulating film of each transistor. The first gate insulating layer 13 may be an inorganic layer including an inorganic material such as silicon oxide ($SiO_x$), silicon nitride ($SiN_x$) or silicon oxynitride (SiO$_x$N$_y$) or may have a structure in which the above materials may be stacked on each other.

The first gate conductive layer may be disposed on the first gate insulating layer 13. The first gate conductive layer may include the gate electrode G1 of the first transistor T1 and a first capacitive electrode CSE1 of a storage capacitor. The gate electrode G1 may overlap the channel region ACT_c of the active layer ACT in the thickness direction. The first capacitive electrode CSE1 may be overlapped by a second capacitive electrode CSE2, which will be described later, in the thickness direction. In an embodiment, the first capacitive electrode CSE1 may be integrally connected to the gate electrode G1. The first capacitive electrode CSE1 may be overlapped by the second capacitive electrode CSE2 in the thickness direction, and the storage capacitor may be formed between them.

The first gate conductive layer may be, but is not limited to, a single layer or a multilayer made of any one or more of molybdenum (Mo), aluminum (Al), chromium (Cr), gold (Au), titanium (Ti), nickel (Ni), neodymium (Nd), copper (Cu), and alloys of the same.

The first interlayer insulating layer 15 may be disposed on the first gate conductive layer. The first interlayer insulating layer 15 may function as an insulating film between the first gate conductive layer and other layers disposed on the first gate conductive layer. The first interlayer insulating layer 15 may cover and protect the first gate conductive layer. The first interlayer insulating layer 15 may be an inorganic layer including an inorganic material such as silicon oxide (SiO$_x$), silicon nitride (SiN$_x$) or silicon oxynitride (SiO$_x$N$_y$) or may have a structure in which the above materials may be stacked on each other.

A first data conductive layer may be disposed on the first interlayer insulating layer 15. The first data conductive layer may include a first source electrode SE and a first drain electrode DE of the first transistor T1, a data line DTL, and the second capacitive electrode CSE2.

The first source electrode SE and the first drain electrode DE of the first transistor T1 may respectively contact the conducting regions ACT_a and ACT_b of the active layer ACT through contact holes penetrating the first interlayer insulating layer 15 and the first gate insulating layer 13. The first source electrode SE of the first transistor T1 may be electrically connected to the light blocking layer BML through another contact hole.

The data line DTL may transmit a data signal to other transistors (not illustrated) included in the display panel 10. Although not illustrated in the drawings, the data line DTL may be connected to source/drain electrodes of other transistors to transmit a received signal to the source/drain electrodes.

The second capacitive electrode CSE2 may overlap the first capacitive electrode CSE1 in the thickness direction. In an embodiment, the second capacitive electrode CSE2 may be integrally connected to the first source electrode SE.

The first data conductive layer may be, but is not limited to, a single layer or a multilayer made of any one or more of molybdenum (Mo), aluminum (Al), chromium (Cr), gold (Au), titanium (Ti), nickel (Ni), neodymium (Nd), copper (Cu), and alloys of the same.

The second interlayer insulating layer 17 may be disposed on the first data conductive layer. The second interlayer insulating layer 17 may function as an insulating film between the first data conductive layer and other layers disposed on the first data conductive layer. The second interlayer insulating layer 17 may cover and protect the first data conductive layer. The second interlayer insulating layer 17 may be an inorganic layer including an inorganic material such as silicon oxide (SiO$_x$), silicon nitride (SiN$_x$) or silicon oxynitride (SiO$_x$N$_y$) or may have a structure in which the above materials may be stacked on each other.

A second data conductive layer may be disposed on the second interlayer insulating layer 17. The second data conductive layer may include a first voltage wiring VL1, a second voltage wiring VL2, and a first conductive pattern CDP. A high potential voltage (or a first power supply voltage) to be supplied to the first transistor T1 may be applied to the first voltage wiring VL1, and a low potential voltage (or a second power supply voltage) to be supplied to a second electrode 22 may be applied to the second voltage wiring VL2. An alignment signal needed to align the light emitting elements 30 may be transmitted to the second voltage wiring VL2 during a manufacturing process of the display panel 10.

The first conductive pattern CDP may be connected to the second capacitive electrode CSE2 through a contact hole formed in the second interlayer insulating layer 17. The second capacitive electrode CSE2 may be integrated with the first source electrode SE of the first transistor T1, and the first conductive pattern CDP may be electrically connected to the first source electrode SE. The first conductive pattern CDP may also contact a first electrode 21 to be described later, and the first transistor T1 may transmit the first power supply voltage received from the first voltage wiring VL1 to the first electrode 21 through the first conductive pattern CDP. Although the second data conductive layer includes one second voltage wiring VL2 and one first voltage wiring VL1 in the drawings, the disclosure is not limited thereto. The second data conductive layer may also include more first voltage wirings VL1 and more second voltage wirings VL2.

The second data conductive layer may be, but is not limited to, a single layer or a multilayer made of at least one of molybdenum (Mo), aluminum (Al), chromium (Cr), gold (Au), titanium (Ti), nickel (Ni), neodymium (Nd), copper (Cu), and alloys of the same.

The first planarization layer 19 may be disposed on the second data conductive layer. The first planarization layer 19 may include an organic insulating material, for example, an organic material such as polyimide (PI) and may perform a surface planarization function.

First banks BNL1, electrodes 21 and 22, the light emitting elements 30, connection electrodes CNE1 and CNE2, and the second bank BNL2 may be disposed on the first planarization layer 19. Insulating layers PAS1 through PAS4 may be disposed on the first planarization layer 19.

The first banks BNL1 may be directly disposed on the first planarization layer 19. The first banks BNL1 may extend in the second direction DR2 in each subpixel PXn but may be disposed within the emission area EMA without extending to other subpixels PXn neighboring in the second direction DR2. The first banks BNL1 may be spaced apart from each other in the first direction DR1, and the light emitting elements 30 may be disposed between them. The first banks BNL1 may be disposed in each subpixel PXn to form linear patterns in the display area DPA of the display panel 10. Although two first banks BNL1 are illustrated in the drawings, the disclosure is not limited thereto. More first banks BNL1 may also be disposed depending on the number of electrodes 21 and 22.

At least a portion of each of the first banks BNL1 may protrude from an upper surface of the first planarization layer 19. The protruding portion of each of the first banks BNL1 may have inclined side surfaces, and light emitted from the light emitting elements 30 may be reflected by the electrodes 21 and 22 disposed on the first banks BNL1 to travel upward above the first planarization layer 19. The first banks BNL1 may provide an area where the light emitting elements 30 may be disposed while functioning as reflective barriers that reflect light emitted from the light emitting elements 30 in an upward direction. The side surfaces of the first banks BNL1 may be inclined in a linear shape. However, the disclosure is not limited thereto, and the first banks BNL1 may also have a semicircular or semi-elliptical shape with a curved outer surface. The first banks BNL1 may include, but are not limited to, an organic insulating material such as polyimide (PI).

The electrodes 21 and 22 may be disposed on the first banks BNL1 and the first planarization layer 19. The electrodes 21 and 22 may include the first electrode 21 and the second electrode 22. The first electrode 21 and the second electrode 22 may extend in the second direction DR2 and may be spaced apart from each other in the first direction DR1.

The first electrode 21 and the second electrode 22 may extend in the second direction DR2 in each subpixel PXn and may be separated from other electrodes 21 and 22 in the cut area CBA. For example, the cut area CBA may be disposed between the emission areas EMA of subpixels PXn neighboring in the second direction DR2, and the first electrode 21 and the second electrode 22 may be separated in the cut area CBA from another first electrode 21 and another second electrode 22 disposed in a subpixel PXn neighboring in the second direction DR2. However, the disclosure is not limited thereto, and some electrodes 21 and 22 may not be separated in each subpixel PXn but may extend beyond subpixels PXn neighboring in the second direction DR2, or only one of the first electrode 21 and the second electrode 22 may be separated.

The first electrode 21 may be electrically connected to the first transistor T1 through a first contact hole CT1, and the second electrode 22 may be electrically connected to the second voltage wiring VL2 through a second contact hole CT2. For example, the first electrode 21 may contact the first conductive pattern CDP through the first contact hole CT1 penetrating the first planarization layer 19 in a portion of the second bank BNL2 which extends in the first direction DR1. The second electrode 22 may also contact the second voltage wiring VL2 through the second contact hole CT2 penetrating the first planarization layer 19 in the portion of the second bank BNL2 which extends in the first direction DR1. However, the disclosure is not limited thereto. In an embodiment, the first contact hole CT1 and the second contact hole CT2 may be disposed in the emission area EMA surrounded by the second bank BNL2 so as not to overlap the second bank BNL2.

Although one first electrode 21 and one second electrode 22 may be disposed in each subpixel PXn in the drawings, the disclosure is not limited thereto, and there may be more first electrodes 21 and second electrodes 22 disposed in each subpixel PXn. The first electrode 21 and the second electrode 22 disposed in each subpixel PXn may not necessarily extend in one direction but may be disposed in various structures. For example, the first electrode 21 and the second electrode 22 may be partially curved or ben, or any one electrode may surround the other electrode.

The first electrode 21 and the second electrode 22 may be directly disposed on the first banks BNL1, respectively. The first electrode 21 and the second electrode 22 may be formed to have greater widths than the first banks BNL1, respectively. For example, the first electrode 21 and the second electrode 22 may cover the outer surfaces of the first banks BNL1, respectively. The first electrode 21 and the second electrode 22 may be disposed on the side surfaces of the first banks BNL1, respectively, and a gap between the first electrode 21 and the second electrode 22 may be smaller than a gap between the first banks BNL1. At least a portion of each of the first electrode 21 and the second electrode 22 may be directly disposed on the first planarization layer 19 to lie in the same plane. However, the disclosure is not limited thereto. In some cases, the widths of the electrodes 21 and 22 may be smaller than those of the first banks BNL1. However, each of the electrodes 21 and 22 may be disposed to cover at least one side surface of the first bank BNL1 to reflect light emitted from the light emitting elements 30.

Each electrode 21 or 22 may include a conductive material having high reflectivity. For example, each electrode 21 or 22 may include at least one metal such as silver (Ag), copper (Cu) or aluminum (Al) as a material having high reflectivity or may be an alloy including aluminum (Al), nickel (Ni) or lanthanum (La). Each electrode 21 or 22 may reflect light, which travels toward the side surfaces of the first banks BNL1 after being emitted from the light emitting elements 30, in the upward direction above each subpixel PXn.

However, the disclosure is not limited thereto, and each electrode 21 or 22 may further include a transparent conductive material. For example, each electrode 21 or 22 may include a material such as indium tin oxide (ITO), indium zinc oxide (IZO) or indium tin zinc oxide (ITZO). In some embodiments, each electrode 21 or 22 may have a structure in which a transparent conductive material and a metal layer having high reflectivity may each be stacked in one or more layers. For example, each electrode 21 or 22 may have a stacked structure of ITO/Ag/ITO, ITO/Ag/IZO, or ITO/Ag/ITZO/IZO.

The electrodes 21 and 22 may be electrically connected to the light emitting elements 30, and a voltage may be applied to the electrodes 21 and 22 so that the light emitting elements 30 can emit light. The electrodes 21 and 22 may be electrically connected to the light emitting elements 30 through the connection electrodes CNE1 and CNE2, and an electrical signal transmitted to the electrodes 21 and 22 may be transmitted to the light emitting elements 30 through the connection electrodes CNE1 and CNE2.

Any one of the first electrode 21 and the second electrode 22 may be electrically connected to anodes of the light emitting elements 30, and the other one may be electrically connected to cathodes of the light emitting elements 30. However, the disclosure is not limited thereto, and the opposite may also be the case.

The electrodes 21 and 22 may be utilized to form an electric field in each subpixel PXn so as to align the light emitting elements 30. The light emitting elements 30 may be placed between the first electrode 21 and the second electrode 22 by an electric field formed on the first electrode 21 and the second electrode 22. The light emitting elements 30 of the display panel 10 may be sprayed onto the electrodes 21 and 22 through an inkjet printing process. In case that ink containing the light emitting elements 30 is sprayed onto the electrodes 21 and 22, alignment signals may be transmitted to the electrodes 21 and 22 to generate an electric field. The light emitting elements 30 dispersed in the ink may be aligned on the electrodes 21 and 22 by a dielectrophoretic force due to the electric field generated on the electrodes 21 and 22.

A first insulating layer PAS1 may be disposed on the first planarization layer 19. The first insulating layer PAS1 may cover the first banks BNL1 and the first and second electrodes 21 and 22. The first insulating layer PAS1 may protect the first and second electrodes 21 and 22 while insulating them from each other. The first insulating layer PAS1 may prevent the light emitting elements 30 disposed on the first insulating layer PAS1 from directly contacting other members and thus being damaged.

In an embodiment, the first insulating layer PAS1 may include openings OP partially exposing the first electrode 21 and the second electrode 22. Each opening OP may partially expose a portion of the electrode 21 or 22 which may be disposed on an upper surface of the first bank BNL1. A portion of each of the connection electrodes CNE1 and CNE2 may contact the electrode 21 or 22 exposed through the opening OP.

The first insulating layer PAS1 may be stepped such that a portion of an upper surface of the first insulating layer PAS1 may be depressed between the first electrode 21 and the second electrode 22. For example, since the first insulating layer PAS1 covers the first electrode 21 and the second electrode 22, the upper surface of the first insulating layer PAS1 may be stepped according to the shapes of the electrodes 21 and 22 disposed under the first insulating layer PAS1. However, the disclosure is not limited thereto.

The second bank BNL2 may be disposed on the first insulating layer PAS1. The second bank BNL2 may include parts extending in the first direction DR1 and the second direction DR2 to form a lattice pattern over the display area DPA (e.g., entire display area DPA) in plan view. The second bank BNL2 may be disposed at the boundary of each subpixel PXn to separate neighboring subpixels PXn.

The second bank BNL2 may surround the emission area EMA and the cut area CBA disposed in each subpixel PXn to separate them from each other. The first electrode 21 and the second electrode 22 may extend in the second direction DR2 to cross a portion of the second bank BNL2 which extends in the first direction DR1. Of a portion of the second bank BNL2 which extends in the second direction DR2, a segment disposed between the emission areas EMA may have a greater width than a segment disposed between the cut areas CBA. Accordingly, the gap between the cut areas CBA may be smaller than the gap between the emission areas EMA.

The second bank BNL2 may be formed to have a greater height than the first banks BNL1. The second bank BNL2 may prevent ink from overflowing to adjacent subpixels PXn in an inkjet printing process during the manufacturing process of the display panel 10. Therefore, the second bank BNL2 may separate inks in which different light emitting elements 30 may be dispersed for different subpixels PXn, so that the inks may not be mixed with each other. Like the first banks BNL1, the second bank BNL2 may include, but is not limited to, polyimide (PI).

The light emitting elements 30 may be disposed on the first insulating layer PAS1. The light emitting elements 30 may be spaced apart from each other along the second direction DR2 in which each electrode 21 or 22 extends and may be aligned substantially parallel to each other. The light emitting elements 30 may extend in a direction, and the direction in which each electrode 21 or 22 extends and the direction in which the light emitting elements 30 extend may be substantially perpendicular to each other. However, the disclosure is not limited thereto, and the light emitting elements 30 may also extend in a direction not perpendicular but oblique to the direction in which each electrode 21 or 22 extends.

The light emitting elements 30 disposed in each of subpixels PXn may include light emitting layers 36 (see FIG. 8) including different materials to emit light of different wavelength bands. Accordingly, light of the first color, light of the second color, and light of the third color may be output from the first subpixel PX1, the second subpixel PX2, and the third subpixel PX3, respectively. However, the disclosure is not limited thereto, and the subpixels PXn may also include the light emitting elements 30 of the same type to emit light of substantially the same color.

Both ends of each light emitting element 30 between the first banks BNL1 may be disposed on the electrodes 21 and 22, respectively. A length by which each light emitting element 30 extends may be greater than the gap between the first electrode 21 and the second electrode 22, and both ends of each light emitting element 30 may be disposed on the first electrode 21 and the second electrode 22, respectively. For example, an end of each light emitting element 30 may be disposed on the first electrode 21, and the other end may be disposed on the second electrode 22.

Each light emitting element 30 may include layers disposed in a direction parallel to an upper surface of the substrate 11 or the first planarization layer 19. The direction in which each light emitting element 30 extends may be parallel to the upper surface of the first planarization layer 19, and semiconductor layers included in each light emitting element 30 may be sequentially disposed along the direction parallel to the upper surface of the first planarization layer 19. However, the disclosure is not limited thereto. In case that each light emitting element 30 has a different structure, the semiconductor layers may be disposed in a direction perpendicular to the upper surface of the first planarization layer 19.

Ends of each light emitting element 30 may contact the connection electrodes CNE1 and CNE2, respectively. For example, an insulating film 38 (see FIG. 8) may not be formed on end surfaces of each light emitting element 30 in the extending direction of the light emitting element 30. Accordingly, semiconductor layers 31 and 32 (see FIG. 8) or electrode layer 37 (see FIG. 8) may be partially exposed, and the exposed semiconductor layers 31 and 32 (see FIG. 8) or the exposed electrode layer 37 (see FIG. 8) may contact the connection electrodes CNE1 and CNE2. However, the disclosure is not limited thereto, and at least a portion of the insulating film 38 of each light emitting element 30 may also be removed to partially expose side surfaces of the semiconductor layers 31 and 32 (see FIG. 8) at both ends. The exposed side surfaces of the semiconductor layers 31 and 32 (see FIG. 8) may directly contact the connection electrodes CNE1 and CNE2.

A second insulating layer PAS2 may be disposed on a portion of each light emitting element 30. For example, the second insulating layer PAS2 disposed on each light emitting element 30 may have a width smaller than the length of the light emitting element 30 to cover the light emitting element 30 while exposing both ends of the light emitting element 30. During the manufacturing process of the display panel 10, the second insulating layer PAS2 may be placed to cover the light emitting elements 30, the electrodes 21 and 22 and the first insulating layer PAS1 and removed to expose both ends of each light emitting element 30. The second insulating layer PAS2 may extend in the second direction DR2 on the first insulating layer PAS1 in plan view to form a linear or island-shaped pattern in each subpixel PXn. The second insulating layer PAS2 may protect the light emitting elements 30 while fixing the light emitting elements 30 in the manufacturing process of the display panel 10.

The connection electrodes CNE1 and CNE2 and a third insulating layer PAS3 may be disposed on the second insulating layer PAS2.

The connection electrodes CNE1 and CNE2 may extend in a direction and may be disposed on the electrodes 21 and 22, respectively. The connection electrodes CNE1 and CNE2 may include a first connection electrode CNE1 disposed on the first electrode 21 and a second connection electrode CNE2 disposed on the second electrode 22. The connection electrodes CNE1 and CNE2 may be spaced apart from each other and may face each other. For example, the first connection electrode CNE1 and the second connection electrode CNE2 may be disposed on the first electrode 21 and the second electrode 22, respectively, and may be spaced apart from each other in the first direction DR1. Each connection electrode CNE1 or CNE2 may form a stripe pattern in the emission area EMA of each subpixel PXn.

Each of the connection electrodes CNE1 and CNE2 may contact the light emitting elements 30. The first connection electrode CNE1 may contact ends of the light emitting elements 30, and the second connection electrode CNE2 may contact the other ends of the light emitting elements 30. The semiconductor layers may be exposed on both end surfaces of each light emitting element 30 in the extending direction of the light emitting element 30, and the connection electrodes CNE1 and CNE2 may directly contact and thus be electrically connected to the exposed semiconductor layers of each light emitting element 30, respectively. Respective sides of the connection electrodes CNE1 and CNE2 which contact both ends of each light emitting element 30 may be disposed on the second insulating layer PAS2. The first connection electrode CNE1 may contact the first electrode 21 through the opening OP exposing a portion of an upper surface of the first electrode 21, and the second connection electrode CNE2 may contact the second electrode 22 through the opening OP exposing a portion of an upper surface of the second electrode 22.

A width of each connection electrode CNE1 or CNE2 measured in a direction may be smaller than a width of each electrode 21 or 22 measured in the direction. The connection electrodes CNE1 and CNE2 may be disposed to contact an end and the other end of each light emitting element 30 while partially covering the upper surfaces of the first electrode 21 and the second electrode 22, respectively. However, the disclosure is not limited thereto, and the connection electrodes CNE1 and CNE2 may also be formed to be wider than the electrodes 21 and 22 to cover both sides of the electrodes 21 and 22.

The connection electrodes CNE1 and CNE2 may include a transparent conductive material. For example, the connection electrodes CNE1 and CNE2 may include ITO, IZO, ITZO, aluminum (Al), or a combination thereof. Light emitted from the light emitting elements 30 may pass through the connection electrodes CNE1 and CNE2 and travel toward the electrodes 21 and 22, but the disclosure is not limited thereto.

Although two connection electrodes CNE1 and CNE2 are disposed in one subpixel PXn in the drawings, the disclosure is not limited thereto. The number of connection electrodes CNE1 and CNE2 may vary according to the number of electrodes 21 and 22 disposed in each subpixel PXn.

The third insulating layer PAS3 may cover the first connection electrode CNE1. The third insulating layer PAS3 may cover not only the first connection electrode CNE1 but also a side of the second insulating layer PAS2 on which the first connection electrode CNE1 may be disposed. For example, the third insulating layer PAS3 may cover the first connection electrode CNE1 and the first insulating layer PAS1 disposed on the first electrode 21. This arrangement may be achieved by placing an insulating material layer that forms the third insulating layer PAS3 in the emission area EMA (e.g., entire emission area EMA) and partially removing the insulating material layer to form the second connection electrode CNE2. In the above process, the insulating material layer that forms the third insulating layer PAS3 may be removed together with an insulating material layer that forms the second insulating layer PAS2, and a side of the third insulating layer PAS3 may be aligned with a side of the second insulating layer PAS2. A side of the second connection electrode CNE2 may be disposed on the third insulating layer PAS3 and may be insulated from the first connection electrode CNE1 by the third insulating layer PAS3 interposed between them.

A fourth insulating layer PAS4 may be disposed on the display area (e.g., entire display area DPA) of the substrate 11. The fourth insulating layer PAS4 may protect members disposed on the substrate 11 from the external environment. However, the fourth insulating layer PAS4 can also be omitted.

Each of the first insulating layer PAS1, the second insulating layer PAS2, the third insulating layer PAS3, and the fourth insulating layer PAS4 described above may include an inorganic insulating material or an organic insulating material. For example, each of the first insulating layer PAS1, the second insulating layer PAS2, the third insulating layer PAS3, and the fourth insulating layer PAS4 may include an inorganic insulating material such as silicon oxide ($SiO_x$), silicon nitride ($SiN_x$), silicon oxynitride ($SiO_xN_y$), aluminum oxide ($Al_xO_y$), aluminum nitride (AlN), or a combination thereof. In other embodiments, each of the first insulating layer PAS1, the second insulating layer PAS2, the third insulating layer PAS3, and the fourth insulating layer PAS4 may include an organic insulating material such as acrylic resin, epoxy resin, phenolic resin, polyamide resin, polyimide resin, unsaturated polyester resin, polyphenylene resin, polyphenylene sulfide resin, benzocyclobutene, cardo resin, siloxane resin, silsesquioxane resin, polymethyl methacrylate, polycarbonate, polymethyl methacrylate-polycarbonate synthetic resin, or a combination thereof. However, the disclosure is not limited thereto.

Figure 8:
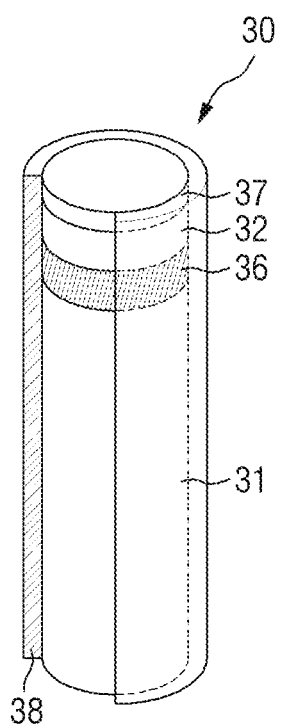
FIG. 8 is a schematic view of a light emitting element according to an embodiment.

FIG. 8 is a schematic view of a light emitting element 30 according to an embodiment.

Referring to FIG. 8, the light emitting element 30 may be a particulate element and may be shaped like a rod or a cylinder having an aspect ratio. The light emitting element 30 may have a nanometer-scale size (about 1 nm to less than about 1 μm) or a micrometer-scale size (about 1 μm to less than about 1 mm). In an embodiment, both the diameter and length of the light emitting element 30 may have a nanometer-scale size or a micrometer-scale size. In other embodiments, the diameter of the light emitting element 30 may have a nanometer-scale size, whereas the length of the light emitting element 30 has a micrometer-scale size. In some embodiments, certain light emitting elements 30 may have a nanometer-scale size in diameter and/or length, whereas other light emitting elements 30 have a micrometer-scale size in diameter and/or length.

In an embodiment, the light emitting element 30 may be an inorganic LED. Specifically, the light emitting element 30 may include a semiconductor layer doped with impurities of any conductivity type (e.g., a p type or an n type). The semiconductor layer may receive an electrical signal from an external power source and emit light of a specific wavelength band.

The light emitting element 30 according to an embodiment may include a first semiconductor layer 31, a light emitting layer 36, a second semiconductor layer 32, and an electrode layer 37 sequentially stacked on each other in a longitudinal direction. The light emitting element 30 may further include an insulating film 38 covering outer surfaces of the first semiconductor layer 31, the second semiconductor layer 32, and a light emitting layer 36.

The first semiconductor layer 31 may be an n-type semiconductor. In case that the light emitting element 30 emits light in a blue wavelength band, the first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be at least one of n-type doped AlGaInN, GaN, AlGaN, InGaN, AlN, and InN. The first semiconductor layer 31 may be doped with an n-type dopant such as Si, Ge, or Sn. For example, the first semiconductor layer 31 may be n-GaN doped with n-type Si. A length of the first semiconductor layer 31 may be, but is not limited to, in the range of about 1.5 to about 5 μm.

The second semiconductor layer 32 may be disposed on the light emitting layer 36 to be described later. The second semiconductor layer 32 may be a p-type semiconductor. In case that the light emitting element 30 emits light in a blue or green wavelength band, the second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may be at least one of p-type doped AlGaInN, GaN, AlGaN, InGaN, AN, and InN. The second semiconductor layer 32 may be doped with a p-type dopant such as Mg, Zn, Ca, Se, or Ba. For example, the second semiconductor layer 32 may be p-GaN doped with p-type Mg. A length of the second semiconductor layer 32 may be, but is not limited to, in the range of about 0.05 to about 0.10 μm.

Although each of the first and second semiconductor layers 31 and 32 is configured as a single layer in the drawing, the disclosure is not limited thereto. For example, each of the first and second semiconductor layers 31 and 32 may also include a larger number of layers, for example, may further include a clad layer or a tensile strain barrier reducing (TSBR) layer depending on the material of the light emitting layer 36.

The light emitting layer 36 may be disposed between the first semiconductor layer 31 and the second semiconductor layer 32. The light emitting layer 36 may include a material having a single or multiple quantum well structure. In case that the light emitting layer 36 includes a material having a multiple quantum well structure, it may have a structure in which quantum layers and well layers may be alternately stacked on each other. The light emitting layer 36 may emit light through combination of electron-hole pairs according to an electrical signal received through the first and second semiconductor layers 31 and 32. In case that the light emitting layer 36 emits light in the blue wavelength band, it may include a material such as AlGaN or AlGaInN. In particular, in case that the light emitting layer 36 has a multiple quantum well structure in which a quantum layer and a well layer may be alternately stacked on each other, the quantum layer may include a material such as AlGaN or AlGaInN, and the well layer may include a material such as GaN or AlInN. For example, the light emitting layer 36 may include AlGaInN as a quantum layer and AlInN as a well layer to emit blue light having a central wavelength band of about 450 to about 495 nm.

However, the disclosure is not limited thereto, and the light emitting layer 36 may also have a structure in which a semiconductor material having a large band gap energy and a semiconductor material having a small band gap energy may be alternately stacked on each other or may include different group 3 to 5 semiconductor materials depending on the wavelength band of light that it emits. Light emitted from the light emitting layer 36 is not limited to light in the blue wavelength band. In some cases, the light emitting layer 36 may emit light in a red or green wavelength band. A length of the light emitting layer 36 may be, but is not limited to, in the range of about 0.05 to about 0.10 μm.

Light emitted from the light emitting layer 36 may be radiated not only toward an outer surface of the light emitting element 30 in the longitudinal direction but also toward side surfaces of the light emitting element 30. The direction of light emitted from the light emitting layer 36 may not be limited to one direction.

The electrode layer 37 may be an ohmic connection electrode. However, the disclosure is not limited thereto, and the electrode layer 37 may also be a Schottky connection electrode. The light emitting element 30 may include at least one electrode layer 37. Although the light emitting element 30 includes one electrode layer 37 in FIG. 8, the disclosure is not limited thereto. In some cases, the light emitting element 30 may include a larger number of electrode layers 37, or the electrode layer 37 may be omitted. The following description of the light emitting element 30 may apply equally even if the number of electrode layers 37 is changed, or the light emitting element 30 further includes another structure.

In case that the light emitting element 30 is electrically connected to an electrode or a connection electrode in the display panel 10 according to an embodiment, the electrode layer 37 may reduce the resistance between the light emitting element 30 and the electrode or the connection electrode. The electrode layer 37 may include a conductive metal. For example, the electrode layer 37 may include at least one of aluminum (Al), titanium (T1), indium (In), gold (Au), silver (Ag), indium tin oxide (ITO), indium zinc oxide (IZO), and indium tin zinc oxide (ITZO). The electrode layer 37 may include an n-type or p-type doped semiconductor material. The electrode layer 37 may include the same material or different materials, but the disclosure is not limited thereto.

The insulating film 38 may surround outer surfaces of the semiconductor layers and the electrode layers described above. For example, the insulating film 38 may surround an outer surface of at least the light emitting layer 36 and extend in the direction in which the light emitting element 30 extends. The insulating film 38 may protect the above members. The insulating film 38 may surround side surfaces of the above members but may expose both ends of the light emitting element 30 in the longitudinal direction.

In the drawing, the insulating film 38 extends in the longitudinal direction of the light emitting element 30 to cover from side surfaces of the first semiconductor layer 31 to side surfaces of the electrode layer 37. However, the disclosure is not limited thereto, and the insulating film 38 may also cover outer surfaces of only some semiconductor layers as well as the light emitting layer 36 or may cover only a portion of an outer surface of the electrode layer 37 to partially expose the outer surface of each electrode layer 37. In other embodiments, an upper surface of the insulating film 38 may be rounded in cross section in an area adjacent to at least one end of the light emitting element 30.

A thickness of the insulating film 38 may be in the range of, but not limited to, about 10 nm to about 1.0 µm. In an embodiment, the thickness of the insulating film 38 may be about 40 nm.

The insulating film 38 may include a material having insulating properties, such as silicon oxide ($SiO_x$), silicon nitride ($SiN_x$), silicon oxynitride ($SiO_xN_y$), aluminum nitride (AlN), aluminum oxide ($Al_xO_y$), or a combination thereof. Therefore, the insulating film 38 may prevent an electrical short circuit that may occur in case that the light emitting layer 36 directly contacts an electrode through which an electrical signal may be transmitted to the light emitting element 30. The insulating film 38 may prevent a reduction in luminous efficiency by protecting the outer surface of the light emitting element 30 including the light emitting layer 36.

An outer surface of the insulating film 38 may be treated. Light emitting elements 30 may be sprayed onto electrodes in a state where they may be dispersed in an ink and may be aligned. Here, the surface of the insulating film 38 may be hydrophobic or hydrophilic-treated so that each light emitting element 30 remains separate from other adjacent light emitting elements 30 in the ink without being agglomerated with them. For example, the outer surface of the insulating film 38 may be treated with a material such as stearic acid or 2,3-naphthalene dicarboxylic acid.

The display panel 10 described above may be bonded to the panel support member 100 to function as the rollable display device 1 that can be wound and unwound as in FIGS. 1 through 3 described above.

The display device 1 including the rollable display panel 10 will now be described with reference to other drawings.

Figure 9:
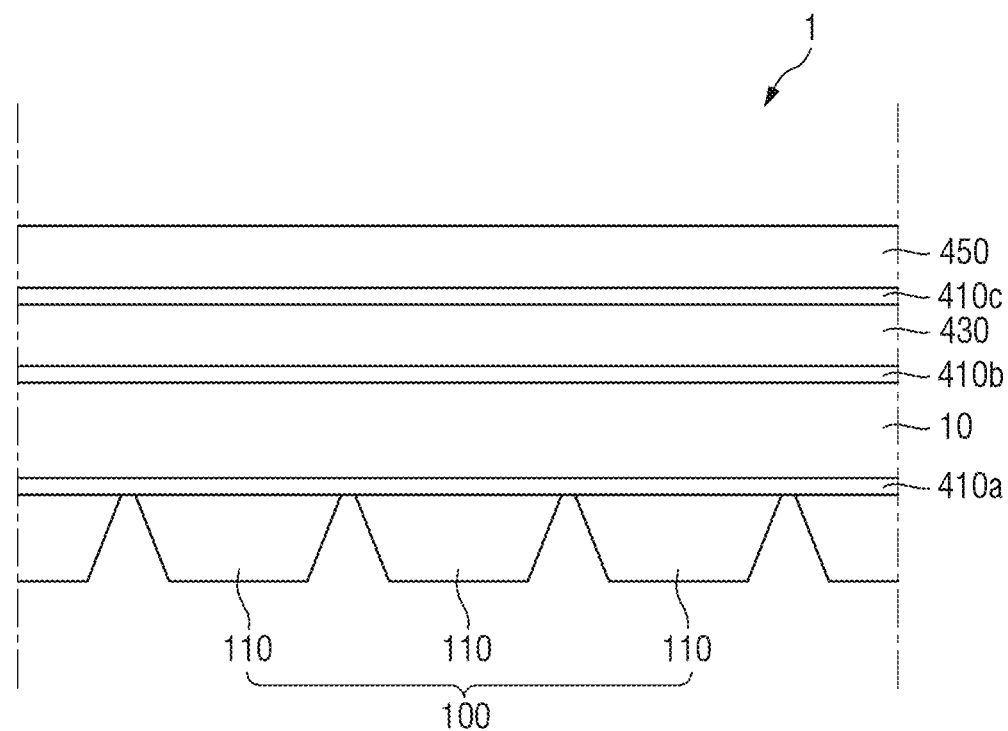
FIG. 9 is a cross-sectional view of a display device according to an embodiment.
Figure 9:
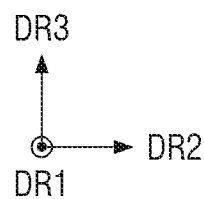
Figure 10:
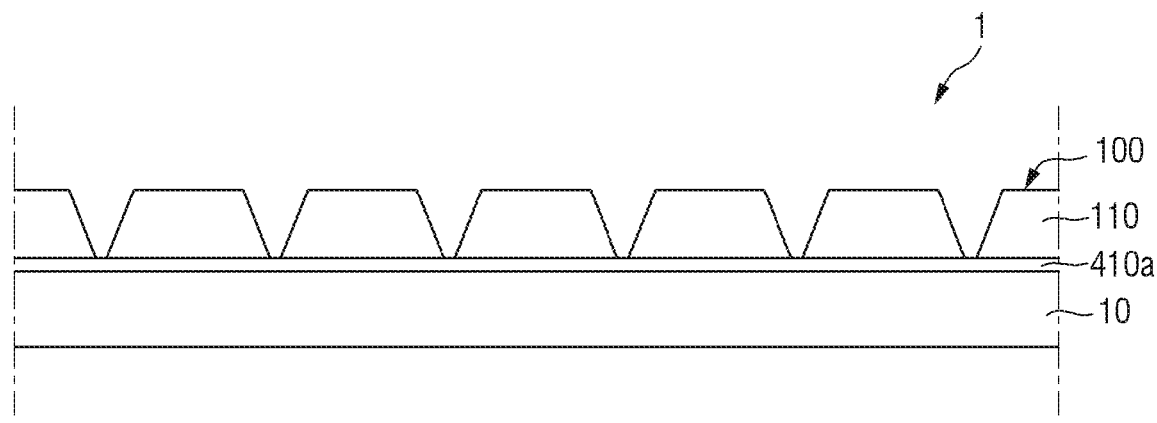
FIG. 10 schematically illustrates a state in which a display panel and a panel support member according to an embodiment may be disposed flat.
Figure 10:
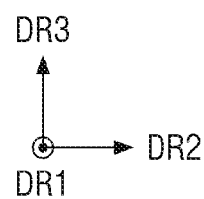
Figure 11:
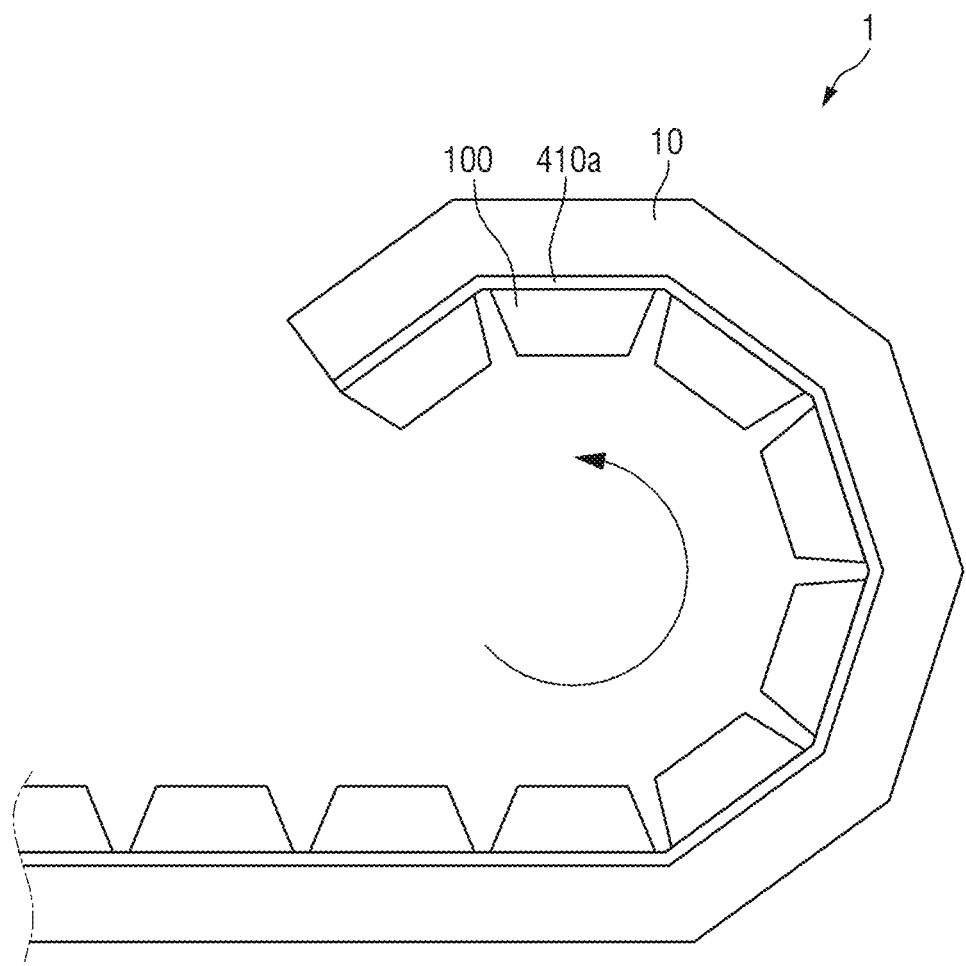
FIG. 11 schematically illustrates a state in which a display panel and a panel support member according to an embodiment may be wound.
Figure 11:
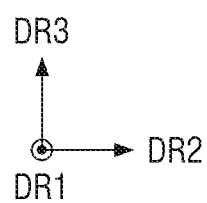
Figure 12:
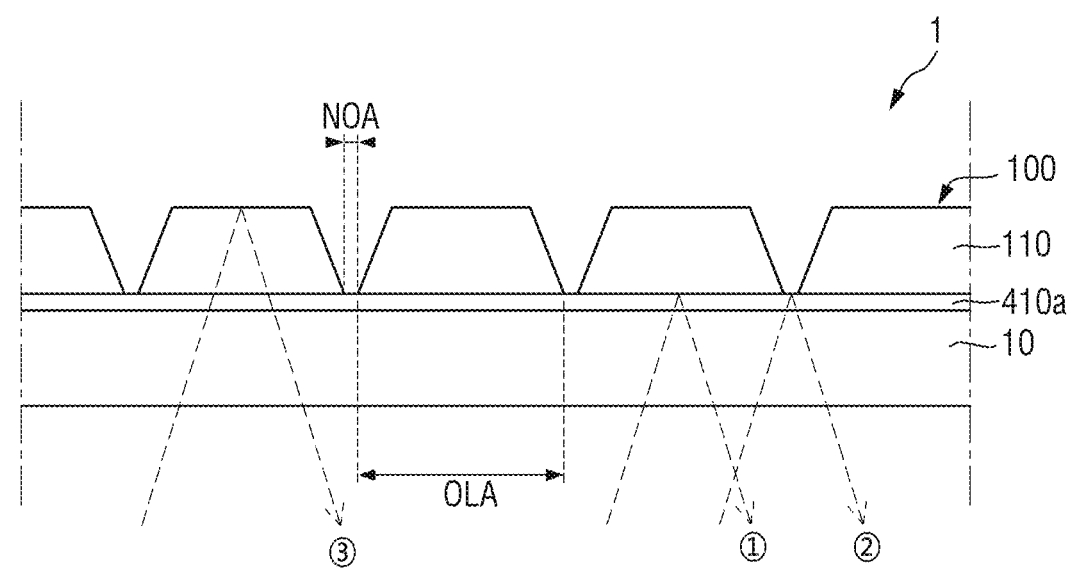
FIG. 12 is a schematic cross-sectional view of a display device.
Figure 13:
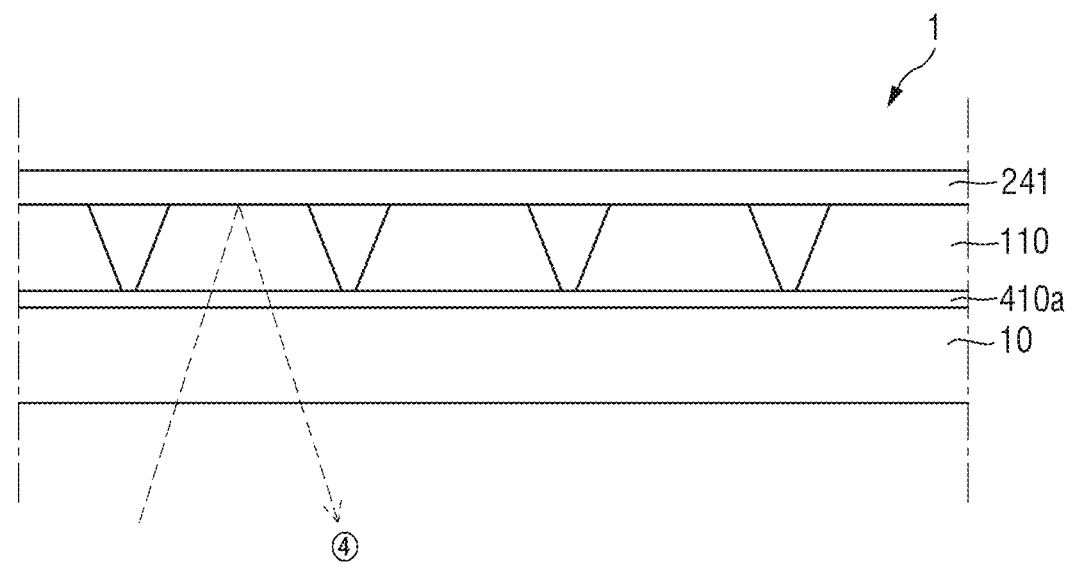
FIG. 13 is a schematic cross-sectional view of a display device in an area in which a panel support member may be disposed.
Figure 13:
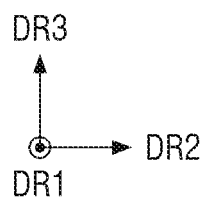

FIG. 9 is a cross-sectional view of a display device 1 according to an embodiment. FIG. 10 schematically illustrates a state in which a display panel 10 and a panel support member 100 according to an embodiment may be disposed flat FIG. 11 schematically illustrates a state in which a display panel 10 and a panel support member 100 according to an embodiment may be wound. FIG. 12 is a schematic cross-sectional view of a display device 1. FIG. 13 is a schematic cross-sectional view of a display device 1 in an area in which the panel support member 100 may be disposed.

FIG. 10 illustrates the display panel 10, a first bonding member 410a, and the panel support member 100 to show the shapes of the display panel 10 and the panel support member 100 in case that they are wound and unwound.

Referring to FIG. 9, the display device 1 according to an embodiment may include the display panel 10 and the panel support member 100 disposed on a rear surface of the display panel 10. The display panel 10 may be the display panel 10 described above with reference to FIGS. 4 through 8.

The panel support member 100 may be disposed on a rear surface of the display panel 10, for example, on a surface opposite a display surface which displays an image. The panel support member 100 may operate to wind or unwind the flexible display panel 10.

The panel support member 100 may include multiple segments 110. The segments 110 may be made of a material having a certain degree of rigidity to support the display panel 10 in case that the display panel 10 is wound and unwound. The segments 110 may include plastic or metal and may be made of a rigid material. In an embodiment, the segments 110 may be made of polyethylene terephthalate (PET).

The segments 110 may extend in the first direction DR1 and may be spaced apart from each other in the second direction DR2. In an embodiment, the segments 110 may be disposed in a stripe shape.

Each of the segments 110 may be shaped like a trapezoid that can be wound around a circular roller in case that the display panel 10 is wound. Each of the segments 110 may be shaped like a trapezoid whose lower side adjacent to the display panel 10 may be longer than an upper side. Side surfaces of each of the segments 110 may be inclined at a positive angle to facilitate winding of the display panel 10. The segments 110 may be spaced apart from each other by a distance to facilitate winding of the display panel 10.

The first bonding member 410a may be disposed between the display panel 10 and the panel support member 100. The first bonding member 410a may attach the segments 110 to the rear surface of the display panel 10 and may include a material having an adhesive strength. The first bonding member 410a may be made of, for example, a pressure sensitive adhesive (PSA).

The display device 1 according to an embodiment may include functional layers on a front surface of the display panel 10, for example, on the display surface of the display panel 10 which displays an image. The functional layers may include a shock absorbing layer 430 and a protective layer 450.

The shock absorbing layer 430 may prevent the display panel 10 from being damaged by absorbing external shock. The shock absorbing layer 430 may be composed of a single layer or multiple stacked layers. The shock absorbing layer 430 may include a material having elasticity, such as polyurethane or polyethylene resin. In an embodiment, the shock absorbing layer 430 may be made of thermoplastic polyurethane (TPU).

The protective layer 450 may protect the display panel 10 and perform at least one of shock absorption, dent prevention, fingerprint prevention, and anti-glare functions. The protective layer 450 may include a transparent polymer film. The transparent polymer film may include at least one of polyacrylate (PA), polyethylene terephthalate (PET), polyethylene naphthalate (PEN), polyethersulfone (PES), polyimide (PI), polyacrylate (PAR), polycarbonate (PC), polymethyl methacrylate (PMMA), and cycloolefin copolymer (COC).

Each of the shock absorbing layer 430 and the protective layer 450 described above may be attached to each other through a bonding member. In an embodiment, a second bonding member 410b may be disposed between the shock absorbing layer 430 and the display panel 10 to attach the shock absorbing layer 430 to the display panel 10. A third bonding member 410c may be disposed between the shock absorbing layer 430 and the protective layer 450 to attach the protective layer 450 to the shock absorbing layer 430.

Referring to FIGS. 10 and 11, the panel support member 100 of a display device 1 according to an embodiment may support the display panel 10 in case that the display panel 10 is wound and unwound. In case that the display panel 10 is unwound and flat, the segments 110 of the panel support member 100 may be aligned flat on the flat display panel 10. The segments 110 may support the flat state of the display panel 10 to implement the flat display panel 10. In case that the display panel 10 is wound, the respective side surfaces of the segments 110 of the panel support member 100 may be disposed adjacent to each other to form a circular shape with a radius of curvature, thereby winding the display panel 10. Although the display panel 10 may be wound at an angle in the drawings, the disclosure is not limited thereto, and the display panel 10 may also be wound in a circular shape.

Referring to FIGS. 12 and 13, the display device 1 may include overlap areas OLA in which the display panel 10 and the segments 110 overlap in the third direction DR3. The display device 1 may include non-overlap areas NOA in which the display panel 10 and the segments 110 may not overlap in the third direction DR3.

External light incident from the front surface which may be the display surface of the display panel 10 may be reflected in the display device 1. In an embodiment, any one of the light rays incident from the front surface of the display panel 10 may be first light ① that passes through the display panel 10 and the first bonding member 410a and may be reflected from an outer surface of the first bonding member 410a of the non-overlap areas NOA. Another one of the light rays incident from the front surface of the display panel 10 may be second light ② that passes through the display panel 10 and the first bonding member 410a and may be reflected from an interface between each of the segments 110 of the overlap areas OLA and the first bonding member 410a.

The first light ① may be reflected from a surface of a segment 110, and the second light ② may be reflected from the outer surface of the first bonding member 410a. Thus, the first light ① and the second light ② may be reflected by different materials. Since the reflectivity of the segments 110 and the reflectivity of the outer surface of the first bonding member 410a may be different from each other, contrast at the front surface of the display panel 10 may increase due to a difference between the amount of the first light ① and the amount of the second light ②. This may degrade the display quality of the display panel 10.

In addition, A light ray incident from the front surface of the display panel 10 may be third light ③ that passes through the display panel 10, the first bonding member 410a and the segments 110 and may be reflected from an outer surface of each of the segments 110 of the overlap areas OLA. In addition, the display panel 10 may include an area overlapping the first lighting member 241 (see also FIG. 3) disposed on a rear surface of the display panel 10 and an area not overlapping the first lifting member 241. A light ray incident from the front surface of the display panel 10 may be fourth light ④ that passes through the display panel 10, the first bonding member 410a and the segments 110 and may be reflected from an interface between each of the segments 110 of the overlap areas OLA and the first lifting member 241.

The third light ③ may be reflected from the outer surface of each segment 110, and the fourth light ④ may be reflected from the first lifting member 241. Thus, the third light ③ and the fourth light ④ may be reflected by different materials. Since the reflectivity of the outer surface of each segment 110 and the reflectivity of the first lifting member 241 may be different from each other, contrast at the front surface of the display panel 10 may increase due to a difference between the amount of the third light ③ and the amount of the fourth light ④. This may degrade the display quality of the display panel 10.

A display device 1 that may include the display panel 10 and the panel support member 100 and be capable of improving display quality will now be described with reference to other drawings.

Figure 14:
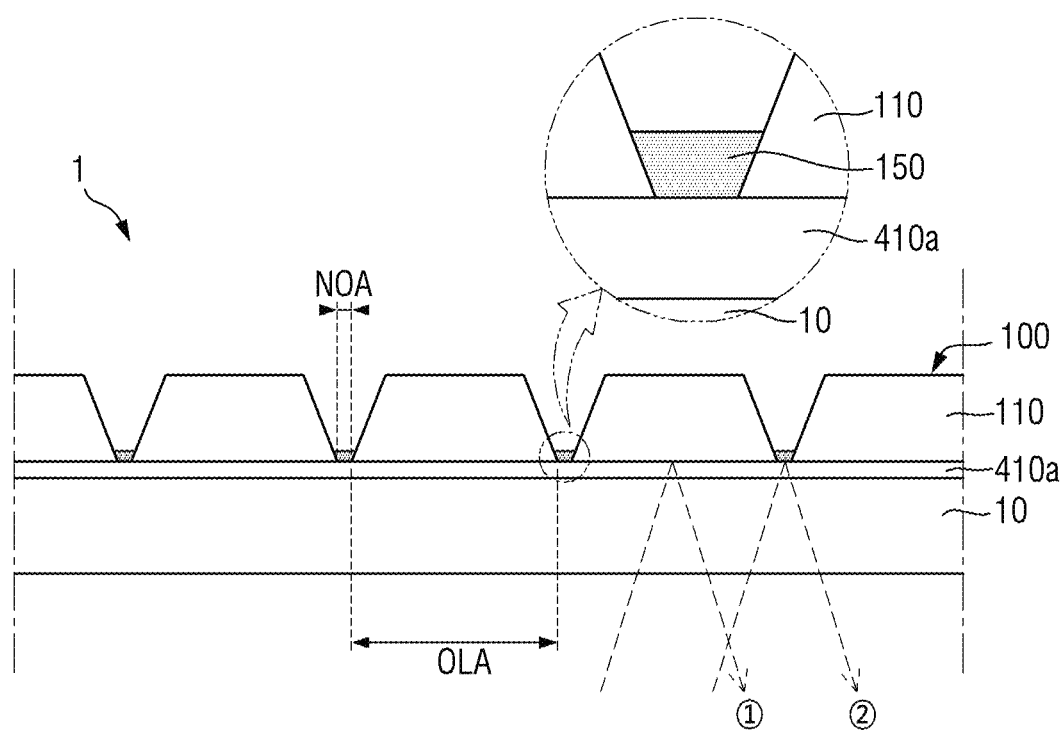
FIG. 14 is a schematic cross-sectional view of a display device according to an embodiment.

FIG. 14 is a schematic cross-sectional view of a display device 1 according to an embodiment.

Referring to FIG. 14, a display device 1 according to an embodiment may include the display panel 10, the first bonding member 410a, and the panel support member 100. The panel support member 100 may include multiple segments 110.

In an embodiment, the display device 1 may include reflective layers 150, each being disposed between the segments 110. The reflective layers 150 may reflect external light incident from the front surface of the display panel 10.

Specifically, the reflective layers 150 may be disposed in the non-overlap areas NOA in which the segments 110 and the display panel 10 may not overlap. The reflective layers 150 may prevent contrast from increasing depending on a material from which external light may be reflected. To this end, the reflective layers 150 may include a material having the same reflectivity as the segments 110. In an embodiment, in case that the segments 110 are made of PET, the reflective layers 150 may be made of PET or a material having the same reflectivity as PET. However, the reflective layers 150 are not limited thereto and may also use a material having reflectivity equivalent to that of the segments 110, for example, may use photoresist. In another embodiment, the reflective layers 150 may include metal oxide particles such as titanium oxide ($TiO_2$), zirconium oxide ($ZrO_2$), aluminum oxide ($Al_xO_y$), indium oxide ($In_2O_3$), zinc oxide (ZnO), tin oxide ($SnO_2$), or a combination thereof. The reflective layers 150 may be formed by a method such as photolithography, inkjet printing, or laminating.

In an embodiment, light incident from the outside through the display panel 10 may include first light ① that may be reflected in the overlap areas OLA and second light ② that may be reflected in the non-overlap areas NOA. If the segments 110 and the reflective layers 150 have the same reflectivity, the first light ① reflected by the segments 110 and the second light ② reflected by the reflective layers 150 may be reflected by a same amount, thereby significantly reducing contrast.

In another embodiment, the reflectivity of the reflective layers 150 may be in the range of about 90% to about 110% of the reflectivity of the segments 110. In case that the reflectivity of the reflective layers 150 may be in the range of about 90% to about 110%, for example, ±10% of the reflectivity of the segments 110, the contrast of the first light ① and the second light ② can be sufficiently reduced.

In an embodiment, the reflective layers 150 may be disposed in the non-overlap areas NOA in which the segments 110 and the display panel 10 may not overlap. Each of the reflective layers 150 may be disposed between the segments 110. Thus, like the segments 110, the reflective layers 150 may extend in the first direction DR1 and may be spaced apart from each other in the second direction DR2. For example, the reflective layers 150 may be formed in a stripe shape. The reflective layers 150 may have a thickness of about 100 μm or less to prevent interference in case that the segments 110 are rolled.

The reflective layers 150 may be disposed on a surface of the first bonding member 410a disposed between the display panel 10 and the segments 110. The reflective layers 150 may contact an upper surface of the first bonding member 410a in the third direction DR3. Each of the reflective layers 150 may be disposed between the segments 110 to contact side surfaces of the segments 110. For example, each of the reflective layers 150 may be disposed on the first bonding member 410a to fill a space between the segments 110.

Each of the reflective layers 150 may overlap at least a portion of the overlap areas OLA in which the display panel 10 and the segments 110 overlap. Since the side surfaces of the segments 110 may be inclined, at least a portion of each reflective layer 150 disposed between the segments 110 may overlap the overlap areas OLA.

As described above, a display device 1 according to an embodiment may include the segments 110 and the reflective layers 150 having equivalent levels of reflectivity to provide equivalent levels of reflectivity of external light. This may prevent an increase in contrast in the display panel 10, thereby improving display quality.

Figure 15:
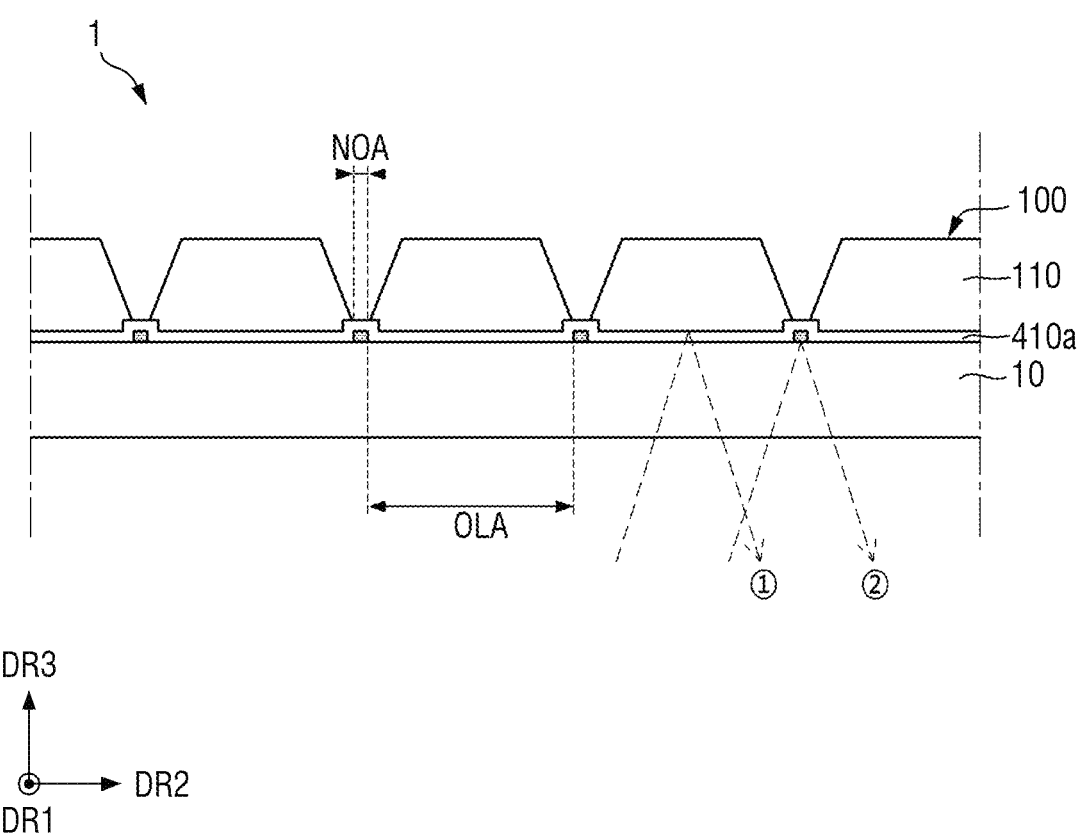
FIG. 15 is a schematic cross-sectional view of a display device according to an embodiment.

FIG. 15 is a schematic cross-sectional view of a display device 1 according to an embodiment.

Referring to FIG. 15, a display device 1 according to an embodiment may include a panel support member 100 and reflective layers 150. In particular, the display device 1 may be substantially identical or similar to the embodiment of FIG. 14 except for the arrangement of the reflective layers 150. Therefore, a redundant description will be omitted, and differences will be described.

According to an embodiment, the reflective layers 150 may be disposed between the display panel 10 and a first bonding member 410a.

Specifically, the reflective layers 150 may be disposed to overlap non-overlap areas NOA in which segments 110 and the display panel 10 may not overlap. The reflective layers 150 may not overlap overlap areas OLA in which the segments 110 and the display panel 10 overlap. The reflective layers 150 may not overlap the segments 110. The reflective layers 150 may be disposed on a surface, e.g., a rear surface of the display panel 10, and the first bonding member 410a may cover the reflective layers 150. The reflective layers 150 may contact the surface of the display panel 10 and contact a lower surface of the first bonding member 410a.

As in the above-described embodiment of FIG. 14, if the segments 110 and the reflective layers 150 have equivalent levels of reflectivity, first light ① reflected by the segments 110 and second light ② reflected by the reflective layers 150 may be reflected by equivalent amounts, thereby significantly reducing contrast.

Figure 16:
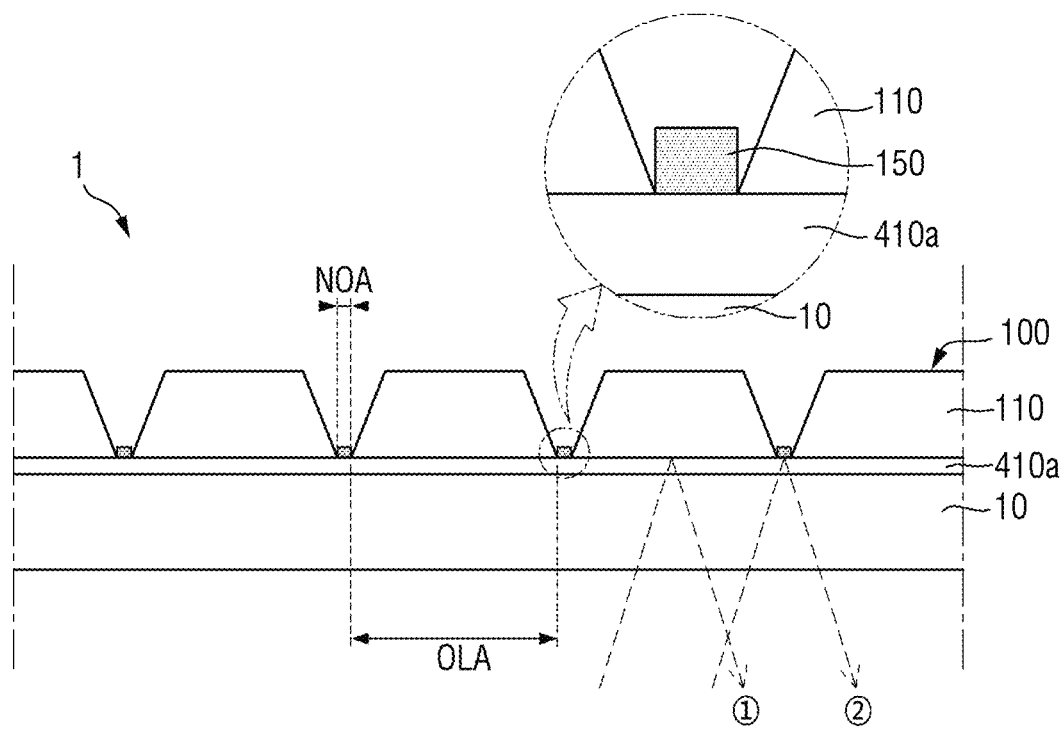
FIG. 16 is a schematic cross-sectional view of a display device according to an embodiment.

FIG. 16 is a schematic cross-sectional view of a display device 1 according to an embodiment.

Referring to FIG. 16, the display device 1 according to an embodiment may include a panel support member 100 and reflective layers 150. In particular, the display device 1 may be substantially identical or similar to embodiments of FIGS. 14 and 15 except for the arrangement of the reflective layers 150. Therefore, a redundant description will be omitted, and differences will be described.

According to an embodiment, each of the reflective layers 150 may be disposed between multiple segments 110. Unlike in the above-described embodiment of FIG. 14, the reflective layers 150 may not overlap the segments 110. The reflective layers 150 may be disposed only in non-overlap areas NOA in which the segments 110 and a display panel 10 may not overlap. Therefore, the reflective layers 150 may contact only an upper surface of a first bonding member 410a and may not overlap side surfaces of the segments 110.

If the segments 110 and the reflective layers 150 have equivalent levels of reflectivity, first light ① reflected by the segments 110 and second light ② reflected by the reflective layers 150 may be reflected by equivalent amounts, thereby significantly reducing contrast.

Figure 17:
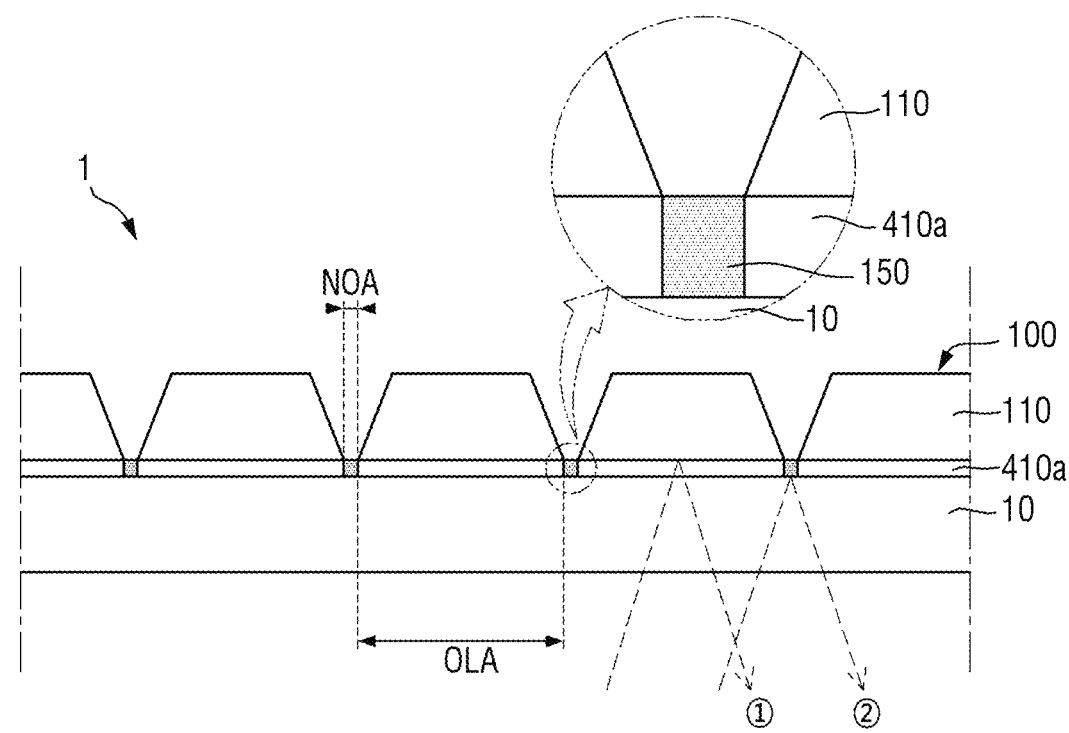
FIG. 17 is a schematic cross-sectional view of a display device according to an embodiment.
Figure 17:
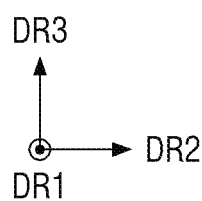

FIG. 17 is a schematic cross-sectional view of a display device 1 according to an embodiment.

Referring to FIG. 17, a display device 1 according to an embodiment may include a panel support member 100 and reflective layers 150. In particular, the display device 1 may be substantially identical or similar to embodiments of FIGS. 14 through 16 except for the arrangement of the reflective layers 150. Therefore, a redundant description will be omitted, and differences will be described.

According to an embodiment, the reflective layers 150 may be disposed on the same layer as first bonding members 410a. The first bonding members 410a may be disposed on a surface of a display panel 10 and may contact the surface of the display panel 10. Each of the reflective layers 150 may be disposed between the first bonding members 410a and may contact side surfaces of the first bonding members 410a. For example, the reflective layers 150 may be disposed on the same layer as the first bonding members 410a.

The reflective layers 150 may be disposed in non-overlap areas NOA in which the segments 110 and the display panel 10 may not overlap. The first bonding members 410a may be disposed in overlap areas OLA in which the segments 110 and the display panel 10 overlap. The reflective layers 150 may be disposed on the surface of the display panel 10 to contact the surface of the display panel 10. The reflective layers 150 may not overlap the segments 110 and may be spaced apart from the segments 110 so as to not contact the segments 110.

In an embodiment, if the segments 110 and the reflective layers 150 have equivalent levels of reflectivity, first light ① reflected by the segments 110 and second light ② reflected by the reflective layers 150 may be reflected by equivalent amounts, thereby significantly reducing contrast.

Figure 18:
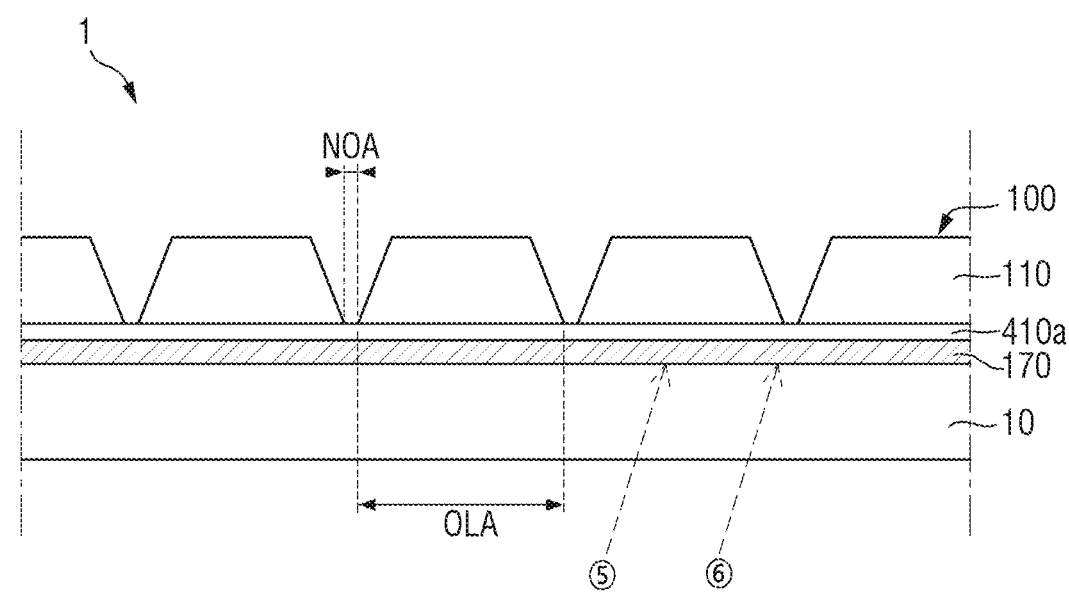
FIG. 18 is a schematic cross-sectional view of a display device according to an embodiment.
Figure 18:
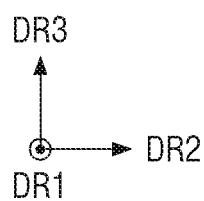

FIG. 18 is a schematic cross-sectional view of a display device 1 according to an embodiment.

Referring to FIG. 18, the display device 1 according to an embodiment may include a panel support member 100 and a light absorbing layer 170. In particular, the display device 1 may be substantially identical or similar to embodiments of FIGS. 14 through 17 except that it includes the light absorbing layer 170. Therefore, a redundant description will be omitted, and differences will be described.

According to an embodiment, the display device 1 may include the light absorbing layer 170 disposed between a display panel 10 and a first bonding member 410a. The light absorbing layer 170 may be disposed in overlap areas OLA in which the display panel 10 and segments 110 overlap and non-overlap areas NOA in which the display panel 10 and the segments 110 may not overlap. For example, the light absorbing layer 170 may be disposed in the area (e.g., entire area) between the display panel 10 and the first bonding member 410a.

The light absorbing layer 170 may absorb external light incident through the display panel 10 to reduce the overall amount of light reflected by the display device 1. In an embodiment, light incident from the outside through the display panel 10 may include fifth light ⑤ that may be absorbed by the overlap areas OLA and sixth light ⑥ that may be absorbed by the non-overlap areas NOA. In case that the light absorbing layer 170 absorbs the external light, most of the fifth light ⑤ and the sixth light ⑥ may be absorbed, thereby significantly reducing the amount of light reflected back to the outside. For example, contrast caused by a difference between the amount of the fifth light ⑤ and the amount of the sixth light ⑥ can be significantly reduced. Accordingly, the display quality of the display device 1 can be improved.

In case that most of the external light incident from the outside is absorbed by the light absorbing layer 170 as described above, the amount of light incident on a first lifting member 241 and/or a second lifting member 242 and the amount of light incident on other areas may all be reduced, resulting in a decrease in contrast.

Embodiments will now be described in more detail through a manufacturing example and an experimental example.

Manufacturing Example: Manufacture of Display Device

The display panel illustrated in FIG. 4 was manufactured, and a panel support member made of PET was attached to the rear surface of the display panel using a PSA as illustrated in FIG. 12 to produce display device sample #1. Display device sample #2 was manufactured under the same conditions as display device sample #1 except that the same PET reflective layers as the panel support member were formed as illustrated in FIG. 14. Display device sample #3 was manufactured under the same conditions as display device sample #1 except that a light absorbing layer made of a black matrix was formed between the display panel and the PSA as illustrated in FIG. 18.

Experimental Example: Measurement of Contrast Image of Display Device

A contrast image of each of display device samples #1, #2 and #3 manufactured in Manufacturing Example was obtained by measuring display device sample #1, #2 or #3 using an optical camera.

Figure 19:
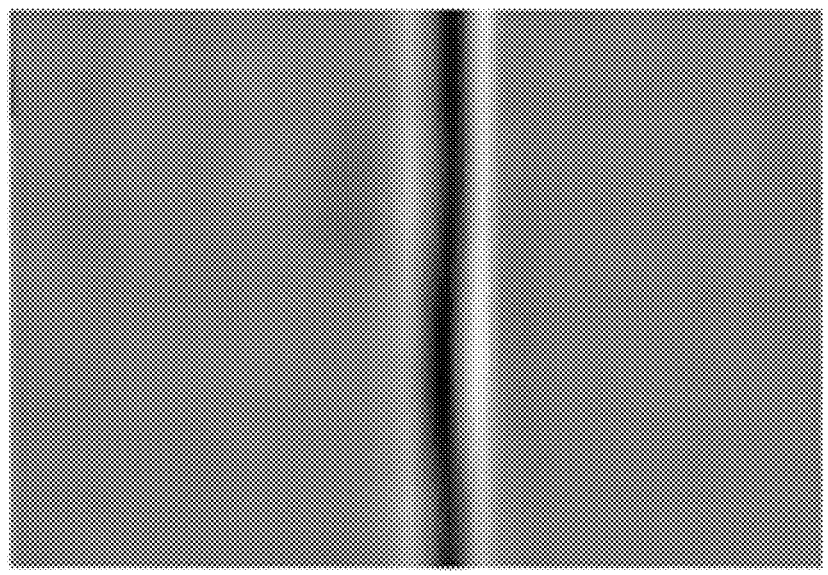
FIG. 19 is a schematic contrast image of display device sample #1.
Figure 20:
FIG. 20 is a schematic contrast image of display device sample #2.
Figure 21:
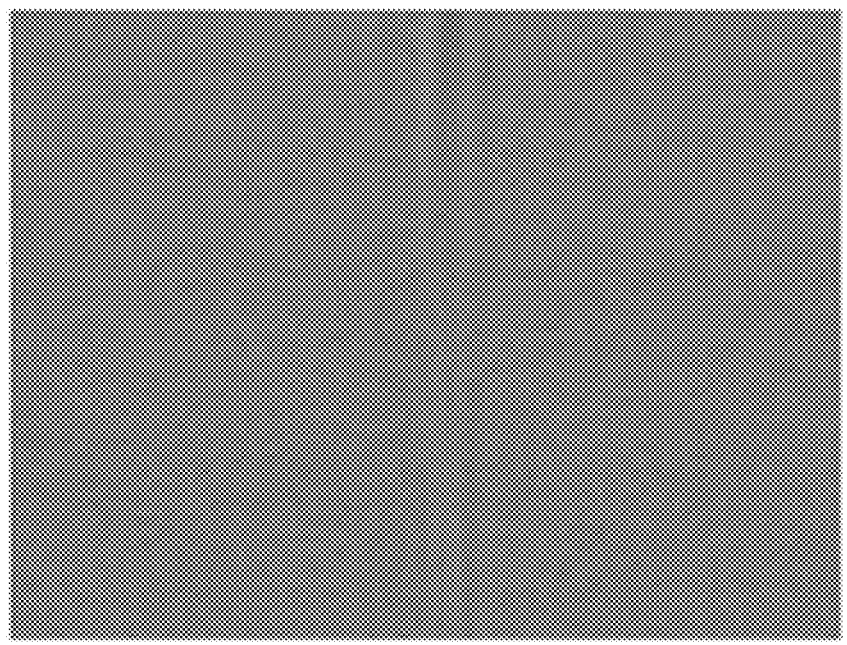
FIG. 21 is a schematic contrast image of display device sample #3.

FIG. 19 is a schematic contrast image of display device sample #1. FIG. 20 is a schematic contrast image of display device sample #2. FIG. 21 is a schematic contrast image of display device sample #3.

Referring to FIG. 19, display device sample #1 without a reflective layer showed strong contrast between an overlap area and a non-overlap area.

On the other hand, referring to FIGS. 20 and 21, display device sample #2 including the reflective layers and display device sample #3 including the light absorbing layer showed very weak contrast between an overlap area and a non-overlap area.

Therefore, it was confirmed that a display device including reflective layers or a light absorbing layer according to an embodiment could improve display quality by significantly reducing the contrast between overlap areas and non-overlap areas.

A display device according to embodiments includes reflective layers or a light absorbing layer to reduce strong contrast shown as external light may be reflected due to a difference in reflectivity between areas in which segments of a panel support member and a display panel may overlap and areas in which the segments of the panel support member and the display panel may not overlap, due to a difference in reflectivity. Accordingly, the display quality of the display device can be improved.

However, the effects of the disclosure are not restricted to those set forth herein. The above and other effects of the disclosure will become more apparent to one of ordinary skill in the art to which the disclosure pertains by referencing the disclosure.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
a display panel having a display surface and an other surface opposing the display surface in a first direction, the display panel being configured to emit light through the display surface;
a panel support member disposed on the other surface of the display panel and including segments that are spaced apart from each other in a second direction transverse to the first direction; and
a reflective layer disposed between the segments when the display device is viewed in the first direction.

2. The display device of claim 1, further comprising non-overlap areas in which the segments and the display panel do not overlap in the first direction, wherein the reflective layer is disposed in each of the non-overlap areas.

3. The display device of claim 2, further comprising overlap areas in which the segments and the display panel overlap in the first direction, wherein the reflective layer is disposed in at least a portion of each of the overlap areas.

4. The display device of claim 1, wherein a reflectivity of the reflective layer and a reflectivity of the segments are equal.

5. The display device of claim 1, wherein a reflectivity of the reflective layer is in a range of about 90% to about 110% of a reflectivity of the segments.

6. The display device of claim 1, wherein the segments extend in a third direction transverse to each of the first direction and the second direction.

7. The display device of claim 6, wherein the reflective layer extends in the third direction and is spaced apart from another reflective layer in the second direction.

8. The display device of claim 1, further comprising a bonding member disposed between the display panel and the segments.

9. The display device of claim 8, wherein
the bonding member has a first surface facing the other surface and a second surface opposing the first surface in the first direction, and
the reflective layer is disposed on the second surface of the bonding member and contacts side surfaces of the segments.

10. The display device of claim 8, further comprising non-overlap areas in which the segments and the display panel do not overlap in the first direction, wherein the reflective layer is disposed between the display panel and the bonding member in the first direction and is disposed in each of the non-overlap areas.

11. The display device of claim 8, wherein
the bonding member has a first surface facing the other surface and a second surface opposing the first surface in the first direction, and
the reflective layer is disposed on the second surface of the bonding member and does not overlap the segments in the first direction.

12. The display device of claim 8, further comprising:
non-overlap areas in which the segments and the display panel do not overlap in the first direction; and
overlap areas in which the segments and the display panel overlap in the first direction,
wherein
the reflective layer and the bonding member are disposed in a same layer,
the reflective layer is disposed in each of the non-overlap areas, and
the bonding member is disposed in each of the overlap areas.

13. The display device of claim 12, wherein
the reflective layer comprises reflective layer portions,
the bonding member comprises bonding member portions, and
the reflective layer portions are respectively disposed between correspondingly adjacent bonding member portions among the bonding member portions and contact side surfaces of the correspondingly adjacent bonding member portions.

* * * * *